United States Patent
Miyake

(10) Patent No.: US 10,242,617 B2
(45) Date of Patent: Mar. 26, 2019

(54) DISPLAY DEVICE, DISPLAY MODULE, ELECTRONIC DEVICE, AND DRIVING METHOD

(71) Applicant: Semiconductor Energy Laboratory Co., Ltd., Atsugi-shi, Kanagawa-ken (JP)

(72) Inventor: Hiroyuki Miyake, Aichi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/605,063

(22) Filed: May 25, 2017

(65) Prior Publication Data
US 2017/0352313 A1    Dec. 7, 2017

(30) Foreign Application Priority Data
Jun. 3, 2016   (JP) ................ 2016-111536

(51) Int. Cl.
| | | |
|---|---|---|
| G09G 3/3233 | (2016.01) | |
| G09G 3/3258 | (2016.01) | |
| G09G 3/3266 | (2016.01) | |
| G09G 3/36 | (2006.01) | |
| H01L 27/12 | (2006.01) | |

(Continued)

(52) U.S. Cl.
CPC ......... *G09G 3/3233* (2013.01); *G09G 3/3258* (2013.01); *G09G 3/3266* (2013.01); *G09G 3/3677* (2013.01); *H01L 27/1225* (2013.01); *H01L 29/7869* (2013.01); *H01L 29/78648* (2013.01); *G02F 1/1368* (2013.01); *G09G 2300/0426* (2013.01); *G09G 2310/08* (2013.01); *G09G 2320/0271* (2013.01); *G09G 2320/0626* (2013.01); *H01L 27/3262* (2013.01)

(58) Field of Classification Search
CPC .. G09G 3/3233; G09G 3/3258; G09G 3/3266; G09G 3/3677; G09G 2320/0271; G09G 2320/0626; G09G 2300/0426; G09G 2310/08; H01L 29/7869; H01L 27/1225; H01L 29/78648; H01L 27/3262; G02F 1/1368

See application file for complete search history.

(56) References Cited

U.S. PATENT DOCUMENTS

| | | |
|---|---|---|
| 5,808,595 A | 9/1998 | Kubota et al. |
| 5,847,410 A | 12/1998 | Nakajima |

(Continued)

FOREIGN PATENT DOCUMENTS

| | | |
|---|---|---|
| JP | 3839460 | 11/2006 |
| JP | 2009-009049 A | 1/2009 |

(Continued)

*Primary Examiner* — Premal R Patel
(74) *Attorney, Agent, or Firm* — Fish & Richardson P.C.

(57) ABSTRACT

Control of a light emission period of a light-emitting element results in higher visibility. A display device includes a signal line, a first scan line, a second scan line, and a pixel circuit. The pixel circuit includes a light-emitting element, a first transistor, and a second transistor. The second transistor includes a back gate. The second scan line is electrically connected to the back gate. The second scan line has a function of controlling the threshold voltage of the second transistor and a function of controlling the light emission period of the light-emitting element.

17 Claims, 16 Drawing Sheets

(51) Int. Cl.
 *H01L 29/786* (2006.01)
 *G02F 1/1368* (2006.01)
 *H01L 27/32* (2006.01)

(56) References Cited

U.S. PATENT DOCUMENTS

| | | | |
|---|---|---|---|
| 6,586,346 | B1 | 7/2003 | Yamazaki et al. |
| 7,301,211 | B2 | 11/2007 | Yamazaki et al. |
| 2001/0030323 | A1 | 10/2001 | Ikeda |
| 2005/0275038 | A1 | 12/2005 | Shih et al. |
| 2006/0208977 | A1 | 9/2006 | Kimura |
| 2007/0072439 | A1 | 3/2007 | Akimoto et al. |
| 2007/0090365 | A1 | 4/2007 | Hayashi et al. |
| 2007/0187760 | A1 | 8/2007 | Furuta et al. |
| 2007/0228389 | A1 | 10/2007 | Hsu et al. |
| 2009/0002281 | A1 | 1/2009 | Okamoto et al. |
| 2009/0186437 | A1 | 7/2009 | Akimoto |
| 2010/0025675 | A1 | 2/2010 | Yamazaki et al. |
| 2010/0102313 | A1 | 4/2010 | Miyairi et al. |
| 2010/0134397 | A1 | 6/2010 | Ishitani et al. |
| 2010/0244020 | A1 | 9/2010 | Sakata et al. |
| 2010/0244029 | A1 | 9/2010 | Yamazaki et al. |
| 2010/0279474 | A1 | 11/2010 | Akimoto et al. |
| 2010/0301326 | A1 | 12/2010 | Miyairi et al. |
| 2011/0003418 | A1 | 1/2011 | Sakata et al. |
| 2011/0122324 | A1* | 5/2011 | Yamashita ............ G09G 3/3233 348/739 |
| 2011/0198483 | A1* | 8/2011 | Kurokawa ........... H01L 27/1225 250/214 R |
| 2012/0075260 | A1* | 3/2012 | Saito .................... G09G 3/3225 345/204 |
| 2012/0075361 | A1 | 3/2012 | Kishi |
| 2012/0169798 | A1* | 7/2012 | Ebisuno ................. G09G 3/325 345/690 |
| 2013/0063413 | A1* | 3/2013 | Miyake .................... G09G 3/32 345/212 |
| 2015/0060675 | A1* | 3/2015 | Akimoto ............... G01T 1/2018 250/361 R |
| 2015/0062101 | A1* | 3/2015 | Kim ...................... G06F 3/0416 345/206 |
| 2015/0091444 | A1* | 4/2015 | Ebisuno ............. H05B 33/0896 315/125 |

FOREIGN PATENT DOCUMENTS

| | | |
|---|---|---|
| JP | 2011-085768 A | 4/2011 |
| WO | WO-2010/140285 | 12/2010 |

* cited by examiner

710C(i,j)

FIG. 7A
(ST61) Completion of element substrate
(ST62) Dicing
(ST63) Die bonding
(ST64) Wire bonding
(ST65) Molding
(ST66) Lead plating and processing
(ST67) Marking
(ST68) Inspection
(ST69) End
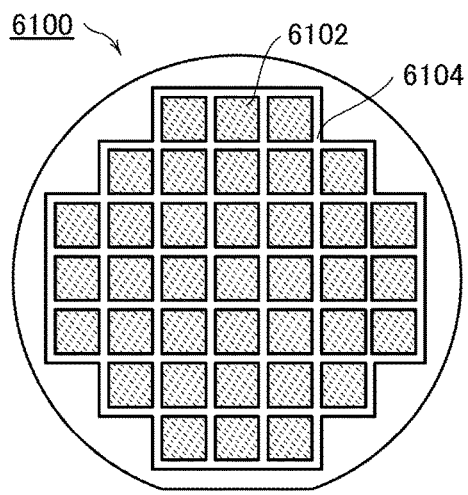
FIG. 7B
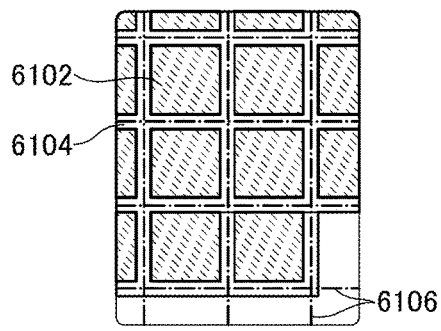
FIG. 7C
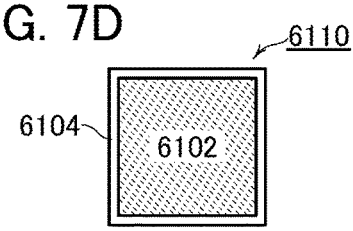
FIG. 7D
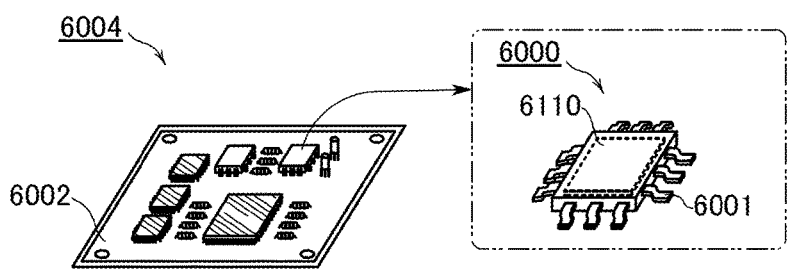
FIG. 7E

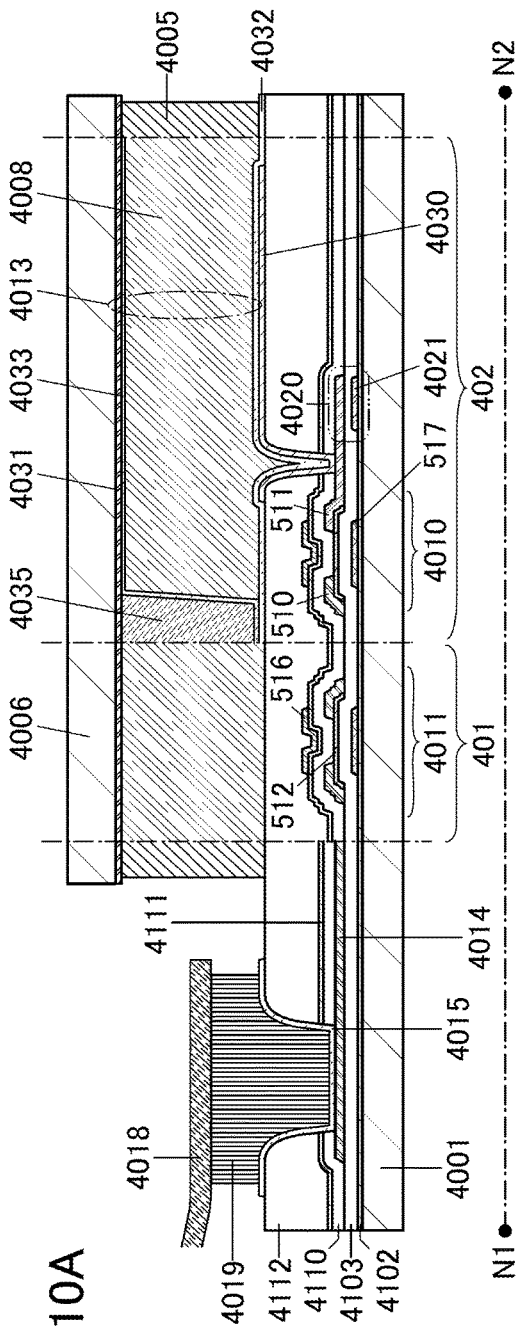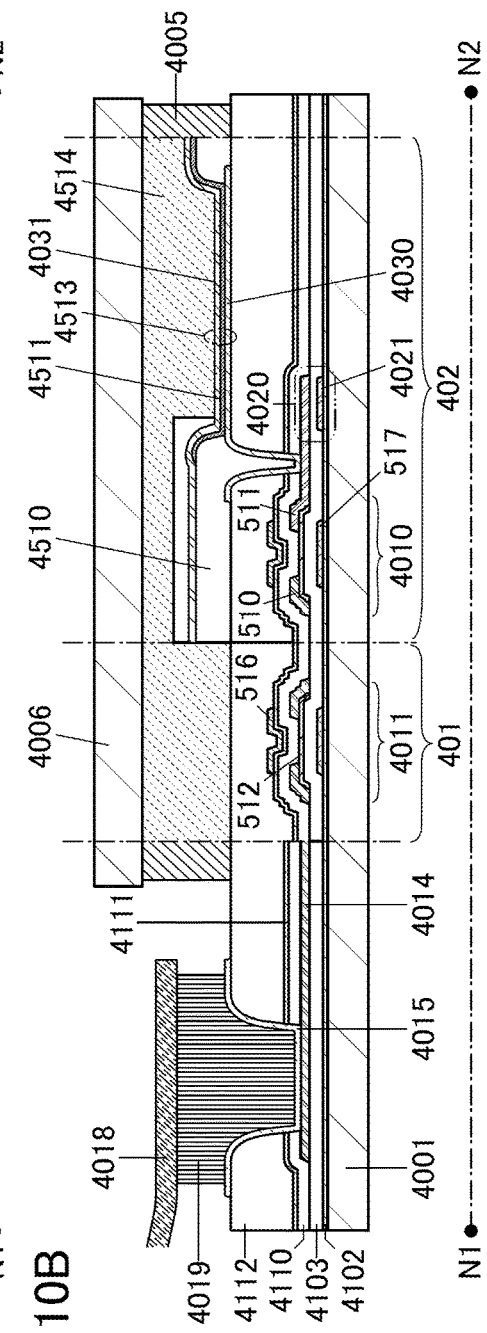
FIG. 10A
FIG. 10B

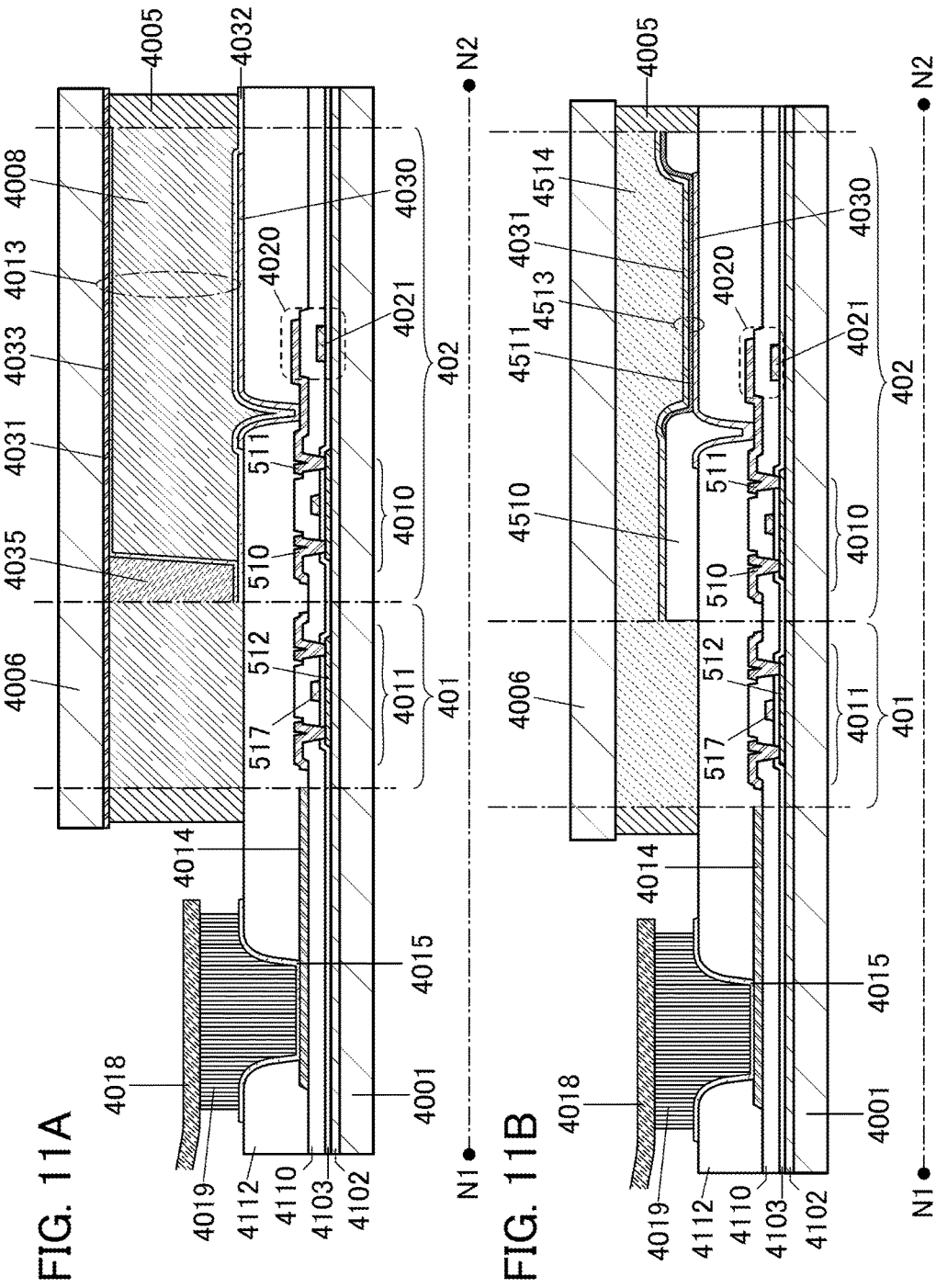

DISPLAY DEVICE, DISPLAY MODULE, ELECTRONIC DEVICE, AND DRIVING METHOD

BACKGROUND OF THE INVENTION

1. Field of the Invention

One embodiment of the present invention relates to a display device, a display module, and an electronic device.

Note that one embodiment of the present invention is not limited to the above technical field. The technical field of one embodiment of the invention disclosed in this specification and the like relates to an object, a method, or a manufacturing method. The present invention relates to a process, a machine, manufacture, or a composition of matter. In particular, one embodiment of the present invention relates to a semiconductor device, a display device, a light-emitting device, a power storage device, a storage device, a driving method thereof, or a manufacturing method thereof.

2. Description of the Related Art

Mobile devices such as smartphones and tablets have become increasingly popular. In addition, novel devices such as head-mounted displays and digitized car-mounted display devices have been used, and high visibility and low power consumption are required.

An active-matrix organic EL display employs a hold-type display method (hereinafter referred to as hold-type driving) that features high response speed, a wide viewing angle, and the like. In hold-type driving, a light-emitting element emits light during one frame period (one frame is a unit of an image to be displayed). Luminance during one frame period is added up as emission luminance to control gradation. For example, in a display device that displays 60 frames for one second, an image is displayed 60 times for one second. In that case, one frame period is approximately 16.67 ms.

Another driving method is an impulsive display method (hereinafter referred to as impulsive driving). In impulsive driving, light is emitted during a selection period of a pixel circuit at the same luminance as total luminance during one frame period to control gradation.

Note that in hold-type driving or impulsive driving, a voltage set method where emission luminance is set by voltage and a current set method where emission luminance is set by current are known.

Although the response speed of an organic EL element is higher than that of a liquid crystal element, a moving image blur that causes a decrease in the resolution of moving images is generated in displaying moving images in hold-type driving. The resolution of moving images refers to visual resolution in displaying moving images and resolution that is perceived by a person in displaying moving images. For example, the resolution of moving images refers to the limiting resolution at which the updating interval of images can be recognized in the case where a wedged figure is scrolled on a screen.

For example, in Patent Document 1, a control method for increasing visibility by controlling gradation with a combination of impulsive driving and hold-type driving has been proposed.

For example, in Patent Document 2, a method for improving the resolution of moving images by inserting a black frame between display frames has been proposed, and a method for suppressing a decrease in lifetime of an organic EL element by decreasing the light emission period of the organic EL element has been disclosed.

REFERENCE

Patent Document

Patent Document 1: Japanese Published Patent Application No. 2009-009049

Patent Document 2: Japanese Published Patent Application No. 2011-085768

SUMMARY OF THE INVENTION

In hold-type driving, a moving image blur is generated in a display region owing to an active-matrix display; thus, there is a problem in that the edge of a displayed moving image or the like becomes unclear, for example.

In hold-type driving, total luminance is used because display is updated every frame. Thus, in order to recognize the change in gradation, a period during which luminance is integrated is needed. As a result, contrast is not increased.

Dot-sequential impulsive driving can suppress a moving image blur generated in hold-type driving; however, a flicker is generated when a still image or the like is displayed because a light emission period is short.

In dot-sequential impulsive driving, a driver needs high current supply capability so that light is emitted during a selection period of a pixel circuit at the same luminance as total luminance during one frame period.

In view of the above problems, an object of one embodiment of the present invention is to provide a display device with a novel structure. Another object of one embodiment of the present invention is to provide a display device with increased visibility of display. Another object of one embodiment of the present invention is to provide a low-power display device.

Note that the objects of one embodiment of the present invention are not limited to the above objects. The above objects do not disturb the existence of other objects. The other objects are not described above and will be described below. The other objects will be apparent from and can be derived from the description of the specification, the drawings, and the like by those skilled in the art. One embodiment of the present invention achieves at least one of the above objects and/or the other objects.

One embodiment of the present invention is a display device that includes a signal line, a first scan line, a second scan line, and a pixel circuit. The pixel circuit includes a light-emitting element, a first transistor, and a second transistor. A gate of the first transistor is electrically connected to the first scan line. One of a source and a drain of the first transistor is electrically connected to the signal line. The other of the source and the drain of the first transistor is electrically connected to a gate of the second transistor. The second transistor includes a back gate. One of a source and a drain of the second transistor is electrically connected to one electrode of the light-emitting element. The second scan line is electrically connected to the back gate of the second transistor.

In the above semiconductor device, the first or second transistor preferably includes an oxide semiconductor in a channel formation region.

In the above semiconductor device, the light-emitting element preferably includes an organic compound layer.

One embodiment of the present invention is a method for driving a display device that includes a display portion and a gate driver. The display portion includes a plurality of signal lines, a plurality of first scan lines, a plurality of second scan lines, a first pixel circuit, and a second pixel circuit. The first pixel circuit and the second pixel circuit each include a light-emitting element, a first transistor, and a second transistor. The second transistor includes a back gate. The gate driver is electrically connected to the plurality of first scan lines and the plurality of second scan lines. The first scan line is electrically connected to a gate of the first transistor included in the first pixel circuit and a gate of the first transistor included in the second pixel circuit. The second scan line is electrically connected to the back gate of the second transistor included in the first pixel circuit and the back gate of the second transistor included in the second pixel circuit. The gate driver has a function of outputting a first scan signal to the plurality of first scan lines. The gate driver has a function of outputting a second scan signal to the plurality of second scan lines. A first period and a second period are included in one frame period. In the first period, light emission and gradation of the light-emitting element are controlled. In the second period, turning-off of the light-emitting element is controlled.

In the above embodiment, the method for driving a display device includes the second period after the first period. In the first period, preferably, the gate driver supplies the first scan signal to the first scan line; the signal line supplies a signal to a gate of the second transistor through the first transistor; current based on the signal is supplied from the second transistor to the light-emitting element; the second scan signal and voltage higher than or equal to voltage of a source of the second transistor are supplied to the back gate of the second transistor; the magnitude of current of the second transistor is controlled by the voltage of the back gate of the second transistor; and light emission and gradation of the light-emitting element are controlled by control of the magnitude of the current of the second transistor. In the second period, preferably, the second scan signal and voltage lower than the voltage of the source of the second transistor are supplied to the back gate of the second transistor; the threshold voltage of the second transistor is controlled by voltage of the back gate of the second transistor; and the threshold voltage of the second transistor is controlled to turn off the light-emitting element and then control a light emission period.

Each of the above embodiments is preferably a display module that includes the display device and a touch sensor.

One embodiment of the present invention can provide a display device with a novel structure. Another object of one embodiment of the present invention can provide a display device with increased visibility of display. Another object of one embodiment of the present invention can provide a low-power display device.

Note that the effects of one embodiment of the present invention are not limited to the above effects. The above effects do not disturb the existence of other effects.

The other effects are not described above and will be described below. The other effects will be apparent from and can be derived from the description of the specification, the drawings, and the like by those skilled in the art. One embodiment of the present invention has at least one of the above effects and/or the other effects. Accordingly, one embodiment of the present invention does not have the above effects in some cases.

BRIEF DESCRIPTION OF THE DRAWINGS

In the accompanying drawings:
FIG. 7A is a flow chart showing an example of a method for manufacturing an electronic component,
FIG. 7B is a top view of a semiconductor wafer,
FIG. 7C is a partial enlarged view of the top view in FIG. 7B,
FIG. 7D is an enlarged view of a chip,
and FIG. 7E is a schematic perspective view of the electronic component;
FIGS. 10A and 10B are cross-sectional views each illustrating a structure example of a display panel;
FIGS. 11A and 11B are cross-sectional views each illustrating a structure example of a display panel.

DETAILED DESCRIPTION OF THE INVENTION

Figure 1:
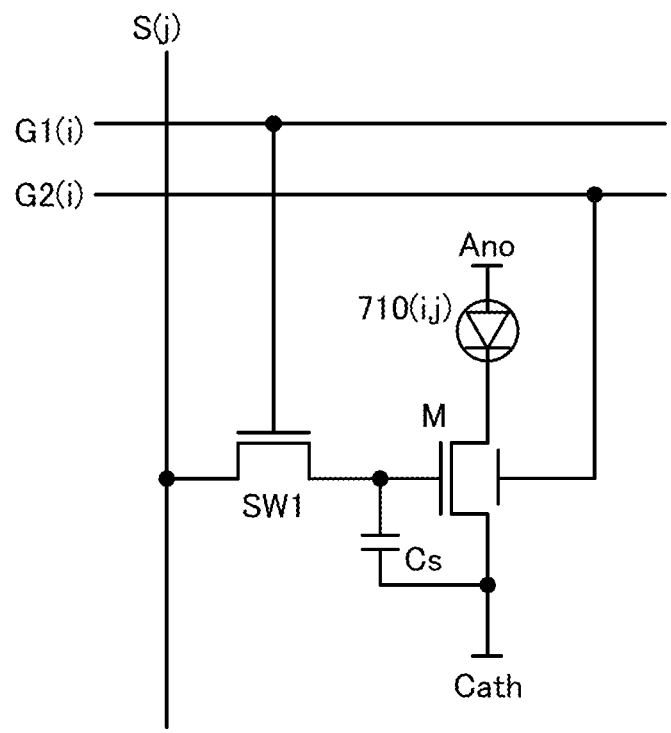
FIG. 1 illustrates the structure of a pixel circuit.

Embodiments will be described below with reference to drawings. However, the embodiments can be implemented with various modes. It will be readily appreciated by those skilled in the art that modes and details can be changed in various ways without departing from the spirit and scope of the present invention. The present invention therefore should not be construed as being limited to the following description of the embodiments.

In the drawings, the size, the layer thickness, or the region is exaggerated for clarity in some cases. Thus, embodiments of the present invention are not limited to such scales. The drawings are schematic views showing ideal examples, and embodiments of the present invention are not limited to shapes or values shown in the drawings.

In this specification, ordinal numbers such as "first", "second", and "third" are used in order to avoid confusion among components, and do not limit the number of components.

In this specification, terms for describing arrangement, such as "over," "above," "under," and "below" are used for convenience for describing the positional relationship between components with reference to drawings. Furthermore, the positional relationship between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow between the source and the drain through the channel region. Note that in this specification and the like, a channel region refers to a region through which current mainly flows.

Furthermore, the functions of a source and a drain might be switched when transistors having different polarities are employed or the direction of current flow is changed in circuit operation, for example. Therefore, the terms "source" and "drain" can be interchanged in this specification and the like.

In this specification and the like, the term "parallel" indicates that an angle formed between two straight lines is greater than or equal to −10° and less than or equal to 10°, and accordingly also includes the case where an angle is greater than or equal to −5° and less than or equal to 5°. The term "perpendicular" indicates that an angle formed between two straight lines is greater than or equal to 80° and less than or equal to 100°, and accordingly also includes the case where an angle is greater than or equal to 85° and less than or equal to 95°.

In this specification and the like, the terms "film" and "layer" can be interchanged with each other. For example, the term "conductive layer" can be changed into the term "conductive film" in some cases. Moreover, the term "insulating film" can be changed into the term "insulating layer" in some cases.

Unless otherwise specified, off-state current in this specification and the like refers to drain current of a transistor in an off state (also referred to as a non-conduction state or a cutoff state). Unless otherwise specified, the off state of an n-channel transistor means that voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to drain current that flows when the gate-source voltage Vgs is lower than the threshold voltage Vth.

The off-state current of a transistor depends on Vgs in some cases. Thus, "the off-state current of a transistor is lower than or equal to I" means "there is Vgs with which the off-state current of a transistor becomes lower than or equal to I" in some cases. Furthermore, "the off-state current of a transistor" means "off-state current in an off state at predetermined Vgs," "off-state current in an off state at Vgs in a predetermined range," "off-state current in an off state at Vgs with which sufficiently reduced off-state current is obtained," or the like in some cases.

As an example, assumption is made of an n-channel transistor where the threshold voltage Vth is 0.5 V and drain current is $1 \times 10^{-9}$ A at Vgs of 0.5 V, $1 \times 10^{-13}$ A at Vgs of 0.1 V, $1 \times 10^{-19}$ A at Vgs of −0.5 V, and $1 \times 10^{-22}$ A at Vgs of −0.8 V. The drain current of the transistor is lower than or equal to $1 \times 10^{-19}$ A at Vgs of −0.5 V or at Vgs in the range of −0.8 V to −0.5 V; thus, it might be said that the off-state current of the transistor is lower than or equal to $1 \times 10^{-19}$ A. Since there is Vgs at which the drain current of the transistor is lower than or equal to $1 \times 10^{-22}$ A, it might be said that the off-state current of the transistor is lower than or equal to $1 \times 10^{-22}$ A.

In this specification and the like, the off-state current of a transistor with a channel width W is sometimes represented by a current value in relation to the channel width W or by a current value per given channel width (e.g., 1 μm). In the latter case, the off-state current might be expressed in the unit with the dimension of current per length (e.g., A/μm).

The off-state current of a transistor depends on temperature in some cases. Unless otherwise specified, the off-state current in this specification might be off-state current at room temperature, 60° C., 85° C., 95° C., or 125° C. Alternatively, the off-state current might be off-state current at a temperature at which reliability required in a semiconductor device or the like including the transistor is ensured or a temperature at which the semiconductor device or the like including the transistor is used (e.g., temperature in the range of 5° C. to 35° C.). The description "off-state current of a transistor is lower than or equal to I" might refer to a situation where there is Vgs at which the off-state current of a transistor is lower than or equal to I at room temperature, 60° C., 85° C., 95° C., 125° C., temperature at which reliability required in a semiconductor device or the like including the transistor is ensured, or temperature at which the semiconductor device or the like including the transistor is used (e.g., temperature in the range of 5° C. to 35° C.).

The off-state current of a transistor depends on voltage Vds between its drain and source in some cases. Unless otherwise specified, the off-state current in this specification might be off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current might be off-state current at Vds at which reliability required in a semiconductor device or the like including the transistor is ensured or Vds at which the semiconductor device or the like including the transistor is used. The description "off-state current of a transistor is lower than or equal to I" might refer to a situation where there is Vgs at which the off-state current of a transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, Vds at which reliability required in a semiconductor device or the like including the transistor is ensured, or Vds at which the semiconductor device or the like including the transistor is used.

In the above description of off-state current, a drain may be replaced with a source. That is, the off-state current sometimes refers to current that flows through a source when a transistor is off.

In this specification and the like, the term "leakage current" sometimes expresses the same meaning as off-state current. In addition, in this specification and the like, the off-state current sometimes refers to current that flows between a source and a drain when a transistor is off, for example.

Note that voltage refers to a difference between potentials of two points, and a potential refers to electrostatic energy (electric potential energy) of a unit electric charge at a given point in an electrostatic field. In general, a difference between a potential of one point and a reference potential (e.g., a ground potential) is merely called a potential or voltage, and a potential and voltage are used as synonyms in many cases. Thus, in this specification, a potential may be rephrased as voltage and voltage may be rephrased as a potential unless otherwise specified.

(Embodiment 1)

In this embodiment, a display device that has a function of controlling display by supply of a signal from a scan line electrically connected to a back gate of a transistor included in a pixel circuit is described with reference to FIG. 1, FIG. 2, FIGS. 3A and 3B, FIG. 4, FIGS. 5A and 5B, and FIGS. 6A to 6D.

Figure 2:
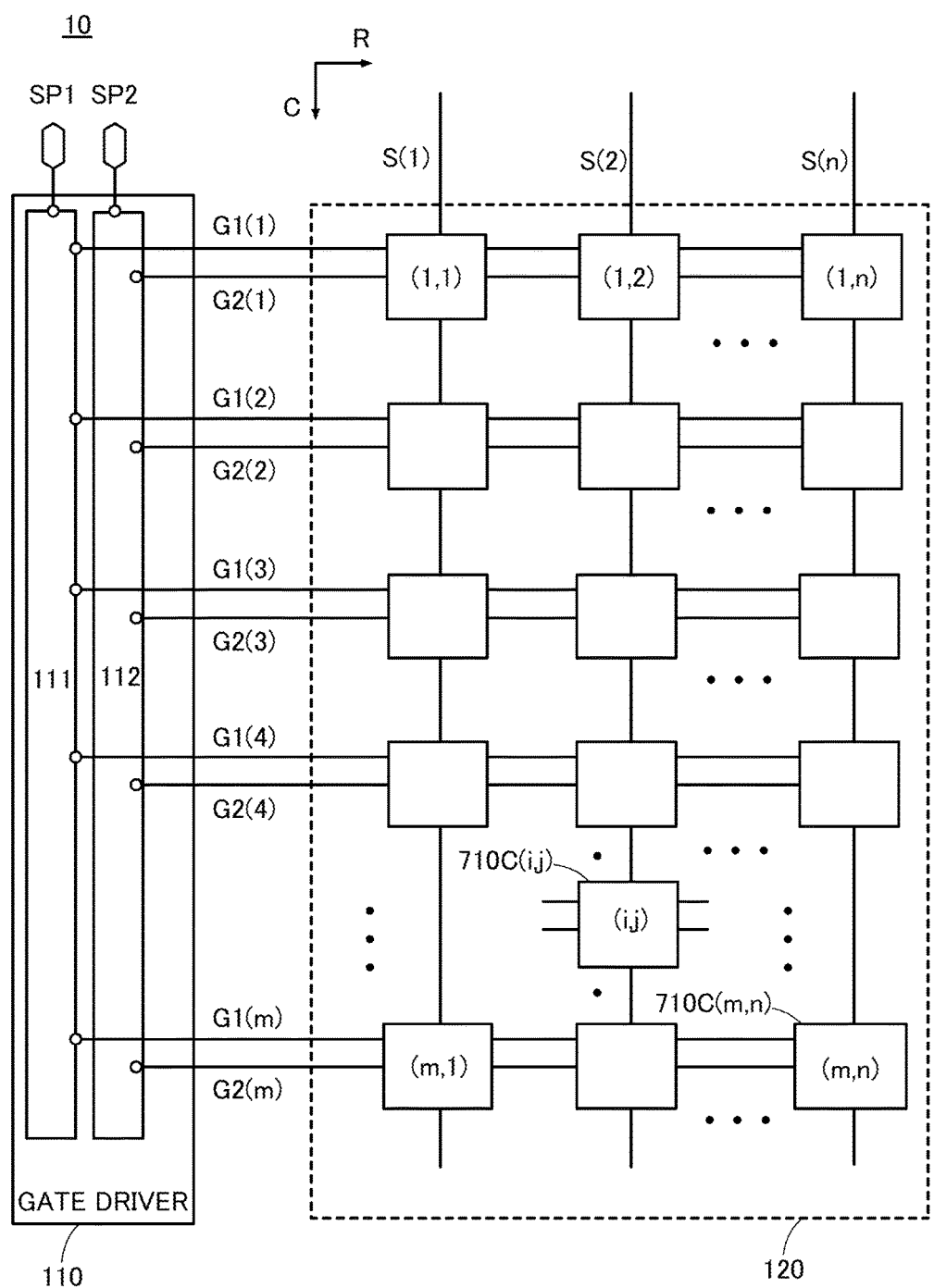
FIG. 2 is a block diagram illustrating the structure of a display device.

FIG. 1 illustrates the structure of a pixel circuit 710C(i,j). FIG. 2 is a block diagram illustrating the structure of a display device 10. One pixel circuit in a display portion 120 of the display device 10 in FIG. 2 is described as the pixel circuit 710C(i,j). The display portion 120 includes m (row direction)×n (column direction) pixel circuits in a matrix, where m is an integer greater than or equal to 1 and n is an integer greater than or equal to 1. Note that i is an integer greater than or equal to 1 and less than or equal to m, and j is an integer greater than or equal to 1 and less than or equal to n.

The pixel circuit 710C(i,j) includes a light-emitting element 710(i,j). For example, the light-emitting element 710(i,j) is preferably a light-emitting element that is driven by direct current. Gradation of the light-emitting element 710(i,j) is controlled by a signal based on voltage or current.

The pixel circuit 710C(i,j) includes a transistor SW1, a transistor M, a capacitor Cs, and the light-emitting element 710(i,j).

The light-emitting element 710(i,j) includes a pixel electrode, a counter electrode, and an organic compound layer positioned between the pixel electrode and the counter electrode. The pixel electrode is one of an anode and a cathode, and the counter electrode is the other of the anode and the cathode. The organic compound layer includes a light-emitting layer.

A gate of the transistor SW1 included in the pixel circuit 710C(i,j) is electrically connected to a scan line G1(i). One of a source and a drain of the transistor SW1 is electrically connected to a signal line S(j). The other of the source and the drain of the transistor SW1 is electrically connected to one electrode of the capacitor Cs and a gate of the transistor M.

The pixel electrode is electrically connected to a drain of the transistor M. The pixel electrode is connected to the counter electrode through the light-emitting element 710(i,j). A source of the transistor M is electrically connected to a Cath terminal. The other electrode of the capacitor Cs is electrically connected to the Cath terminal. A back gate of the transistor M is electrically connected to a scan line G2(i). The pair of gates of the transistor M preferably has regions that overlap with each other with a channel formation region positioned therebetween.

Cathode voltage is applied to the source of the transistor M through the Cath terminal. Anode voltage is applied to the counter electrode through an Ano terminal.

Although the other electrode of the capacitor Cs is electrically connected to the source of the transistor M in the example, the other electrode of the capacitor Cs may be electrically connected to the drain of the transistor M or may be electrically connected to a wiring or electrode to which another voltage is applied.

Drive current of the light-emitting element 710(i,j) is controlled by the voltage of a signal supplied from the signal line S(j). The magnitude of the drive current represents gradation of the light-emitting element 710(i,j).

The display device 10 in FIG. 2 includes a gate driver 110 and the display portion 120. The gate driver 110 includes a shift register circuit 111 and a shift register circuit 112. The display portion 120 includes pixel circuits 710C(1,1) to 710C(m,n).

The display portion 120 described in this embodiment includes the pixel circuits 710C(1,1) to 710C(m,n), first scan lines G1(1) to G1(m), second scan lines G2(1) to G2(m), and signal lines S(1) to S(n).

Figure 3A:
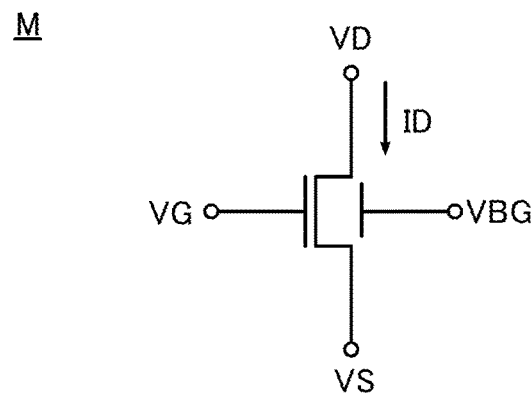
FIG. 3A illustrates connection of a transistor.

FIG. 3A illustrates the transistor M included in the pixel circuit 710C(i,j). Conditions of voltage applied to each terminal of the transistor M for measuring electrical characteristics of the transistor M are shown in Table 1.

A VG terminal (hereinafter referred to as "VG") is electrically connected to the gate of the transistor M. A VS terminal (hereinafter referred to as "VS") is electrically connected to the source of the transistor M. A VD terminal (hereinafter referred to as "VD") is electrically connected to the drain of the transistor M. A VBG terminal (hereinafter referred to as "VBG") is electrically connected to the back gate of the transistor M.

Figure 3B:
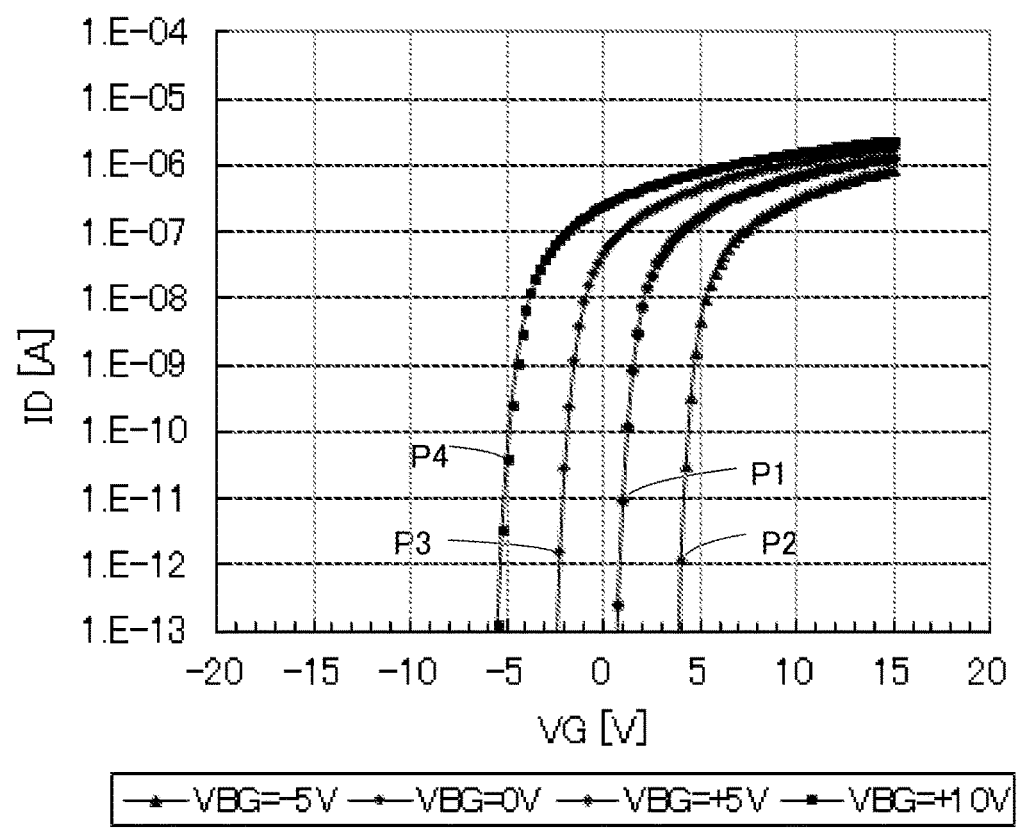
FIG. 3B illustrates an example of electrical characteristics of the transistor.

Electrical characteristics of P1 to P4 in FIG. 3B were measured by applying different voltages to VBG.

TABLE 1

| No. | VD | VS | VBG | VG START | VG END | VG STEP |
|---|---|---|---|---|---|---|
| P1 | 10 V | 0 V | 0 V | −15 V | 15 V | 0.25 V |
| P2 | 10 V | 0 V | −5 V | | | |
| P3 | 10 V | 0 V | 5 V | | | |
| P4 | 10 V | 0 V | 10 V | | | |

Here, measurement was performed while changing gate voltage applied between the gate and the source. Current flowing between the source and the drain was measured as drain current ID. The above measurement method is referred to as IDVG measurement or VGID measurement.

The measured transistor includes an oxide semiconductor in a semiconductor layer and has a channel length of 4 μm and a channel width of 50 μm.

Electrical characteristics of P1 are obtained when a voltage of 0 V is applied to VBG. The drain current ID when VG is 0 V is lower than or equal to the measurement limit. The electrical characteristics are obtained when an oxide semiconductor is used for a channel portion of the transistor.

Here, the measurement limit is lower than or equal to $1×10^{-12}$ A. The IDVG measurement was performed using a semiconductor parameter analyzer (model: 4155C) made by Agilent Technologies Inc.

Electrical characteristics of P2 are obtained when a voltage of −5 V is applied to VBG. The electrical characteristics of P1 are shifted positively. This indicates that the voltage of VG at which the drain current ID is lower than or equal to the measurement limit is shifted positively. It means that the threshold voltage of the transistor is shifted positively.

Electrical characteristics of P3 are obtained when a voltage of 5 V is applied to VBG. The electrical characteristics of P1 are shifted negatively. This indicates that the voltage of VG at which the drain current ID is lower than or equal to the measurement limit is shifted negatively. It means that the threshold voltage of the transistor is shifted negatively.

Electrical characteristics of P4 are obtained when a voltage of 10 V is applied to VBG. The electrical characteristics of P4 are shifted negatively compared to the electrical characteristics of P3. This indicates that the voltage of VG at which the drain current ID is lower than or equal to the measurement limit is further shifted negatively. It means that the threshold voltage of the transistor is further shifted negatively compared to the electrical characteristics of P3.

Figure 4:
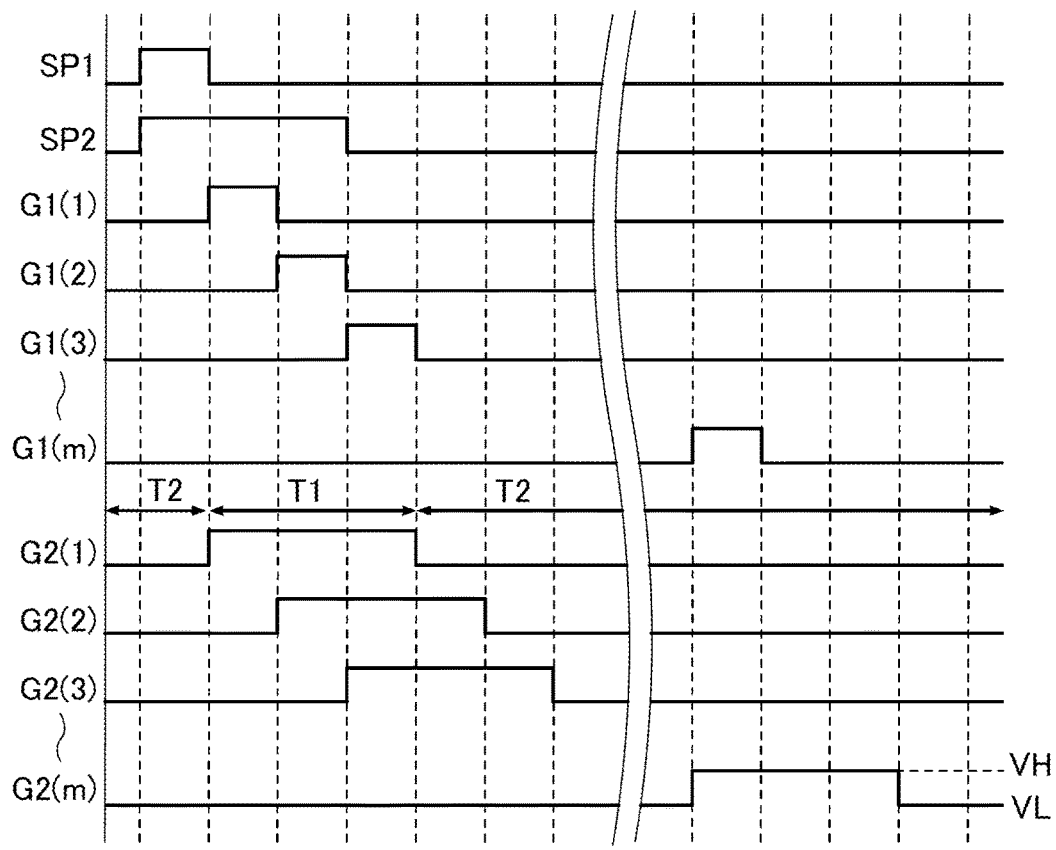
FIG. 4 is a timing chart illustrating an operation example of a display device.

FIG. 4 is a timing chart of the display device 10 that includes the transistor illustrated in FIGS. 3A and 3B. The gate driver 110 controls the pixel circuit 710C(i,j) by two input signals of a start pulse SP1 and a start pulse SP2.

The signal of the start pulse SP1 is input to the shift register circuit 111. The shift register circuit 111 outputs a signal that controls the scan line G1(1) to sequentially select the scan lines G1(2) to G1(m).

The signal of the start pulse SP2 is input to the shift register circuit 112. The shift register circuit 112 outputs a signal that controls the scan line G2(1) to sequentially select the scan lines G2(2) to G2(m).

The signal of the scan line G1 selected by the start pulse SP1 is input to the gate of the transistor SW1 included in the pixel circuit 710C(i,j), so that the voltage of a signal supplied from the signal line S(j) is applied to the gate of the transistor M. Therefore, the light-emitting element 710(i,j) emits light in accordance with the voltage applied to the gate of the transistor M.

Voltage higher than or equal to the voltage of the source of the transistor M is applied to the back gate of the transistor M. The negative shift in the threshold voltage of the transistor M can increase the amount of current. Therefore, the voltage of the signal supplied from the signal line S(j) can be lowered. In FIG. 4, T1 represents a period during which the light-emitting element 710(i,j) emits light.

The signal of the scan line G2 selected by the start pulse SP2 is input to the back gate of the transistor M included in the pixel circuit 710C(i,j), so that the electrical characteristics of the transistor M can be shifted.

Voltage lower than the voltage of the source of the transistor M is applied to the back gate of the transistor M, so that the value of current flowing through the light-emitting element 710(i,j) can be lowered to the value of current that does not contribute to light emission. Therefore, the light emission period can be controlled by voltage applied to the back gate. In a period T2, the light-emitting element 710(i,j) does not emit light owing to the signal of the scan line G2.

Voltage applied to the back gate of the transistor depends on electrical characteristics of the light-emitting element 710(i,j); thus, optimum voltage is applied as appropriate in accordance with characteristics of the light-emitting element.

Figure 5A:
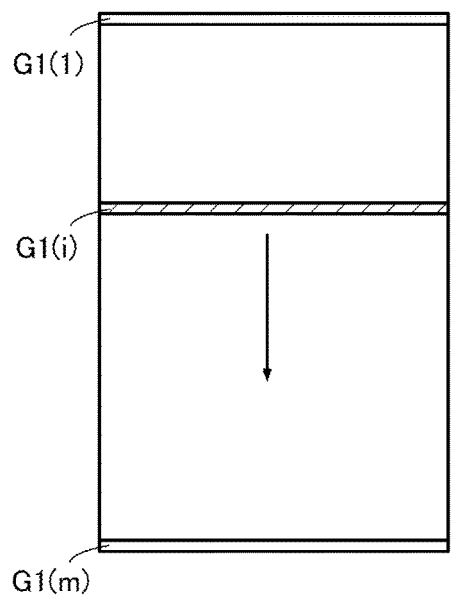
FIGS. 5A and 5B each illustrate an example of display.
Figure 5B:
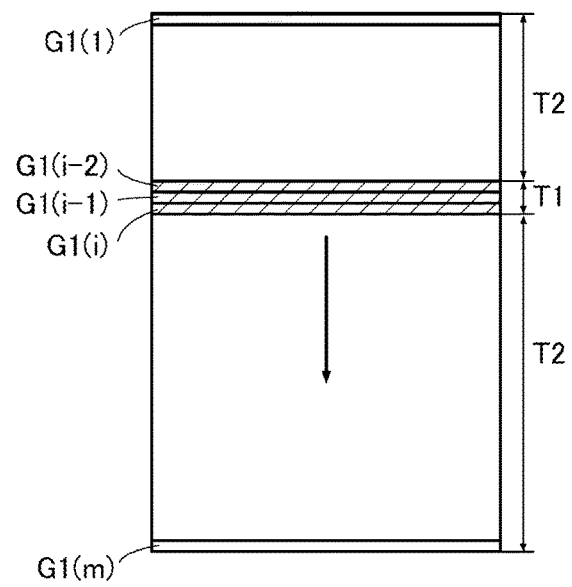

FIGS. 5A and 5B are described. FIG. 5A illustrates an example in which display is performed by input of signals with the same pulse width to the start pulse SP1 and the start pulse SP2. First, the display is updated by G1(i). At the timing when the next scan line G1(i+1) is selected, the voltage of the signal of G2(i) is lower than the voltage of the source of the transistor M. In a region selected by G1(i) where light has been emitted, light emission is terminated.

FIG. 5B illustrates display when driving is performed in accordance with the timing chart in FIG. 4. Light is emitted in a display region corresponding to the scan lines G1(i), G1(i−1), and G1(i−2) in FIG. 5B, and light emission is terminated in other regions. In the light emission period, the display region is explicitly illustrated by hatching. Hold-type driving updates the display of a pixel circuit selected by the scan line. The light-emitting element emits light for one frame period. In contrast, the use of the pixel circuit in FIG. 1 can update display by line-sequential impulsive driving.

Therefore, a period during which the light-emitting element emits light and display is performed is controlled by the start pulse SP2. By making the signal width of the start pulse SP2 variable, when display speed is high, for example, a moving image is displayed, moving image resolution can be improved by the decrease in the light emission period. In addition, total luminance can be secured by suppressing emission luminance by the increase in the light emission period when display speed is low, for example, a still image is displayed. Thus, power consumption can be reduced. The light emission period in line-sequential impulsive driving is longer than that in dot-sequential impulsive driving, and total luminance becomes higher; thus, a flicker can be reduced and visibility can be improved.

Furthermore, the pulse width of the start pulse SP2 may be determined depending on a status detected by a battery monitor of a mobile device. The light emission period in FIG. 5A is shorter than that in FIG. 5B. Therefore, in order to achieve the same display quality, it is necessary to increase the voltage of the signal supplied from the signal line S(j) in consideration of total luminance. In order to reduce power consumption, the voltage of the signal is preferably low. The power consumption can be reduced and optimum display quality can be provided by optimization of the signal width of the start pulse SP2 depending on the battery charge condition.

In a display device that displays 60 frames for one second, there is a method for improving moving image resolution by intentional insertion of a black frame between continuous display frames. For example, when a black frame is inserted, it is necessary to set the number of frames to be displayed for one second more than 60 frames in order to maintain the display quality.

The use of the pixel circuit in FIG. 1 can control the light emission period and a turn-off period in one frame period. Therefore, the display can be controlled by line-sequential impulsive driving. Furthermore, moving image resolution is improved by impulsive driving, so that visibility can be improved.

There is no particular limitation on device structures of various elements such as transistors and capacitors used in the display device 10 described in this embodiment. Device structures are selected to be suited for the functions of the pixel circuit 710C(i,j) included in the display portion 120 and the gate driver 110. Examples of the device structure of a transistor are a top-gate structure, a bottom-gate structure, a dual-gate structure provided with both a gate (front gate) and a bottom gate, and a multi-gate structure including a plurality of gate electrodes for one semiconductor layer. There is no particular limitation on types (e.g., a composition and a crystal structure) of a semiconductor contained in an active layer (channel formation region) of a transistor. A semiconductor used for the active layer is roughly divided into a single crystal semiconductor and a non-single-crystal semiconductor. Examples of a non-single-crystal semiconductor include a polycrystalline semiconductor, a microcrystalline semiconductor, and an amorphous semiconductor. Examples of a semiconductor material include a semiconductor containing one or more kinds of Group 14 elements such as Si, Ge, or C (e.g., silicon, silicon germanium, and silicon carbide), an oxide semiconductor, and a compound semiconductor such as gallium nitride.

In the example of the pixel circuit 710C(i,j) in FIG. 1, transistors with the same conductivity type are included. Here, the transistor SW1 and the transistor M are n-channel transistors and an oxide semiconductor is used for each semiconductor layer. The transistor SW1 is a bottom-gate transistor, and the transistor M is a dual-gate transistor that includes a back gate.

Note that one embodiment of the present invention is not limited to the circuit structure of the pixel circuit 710C(i,j) in FIG. 1. Examples of the circuit structure of the pixel circuit 710C(i,j) which are different from that in FIG. 1 are illustrated in FIGS. 6A to 6D.

Figure 6A:
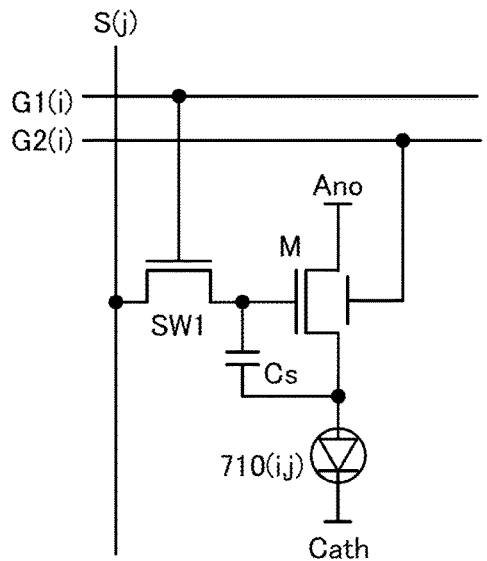
FIGS. 6A to 6D each illustrate the structure of a pixel circuit.

FIG. 6A is different from FIG. 1 in the following points. The pixel electrode is electrically connected to the source of the transistor M. The pixel electrode is connected to the counter electrode through the light-emitting element 710(i,j) The drain of the transistor M is electrically connected to the Ano terminal. The one electrode of the capacitor Cs is electrically connected to the gate of the transistor M. Although the other electrode of the capacitor Cs is electrically connected to the source of the transistor M, the other electrode of the capacitor Cs may be electrically connected to the drain of the transistor M.

Figure 6B:
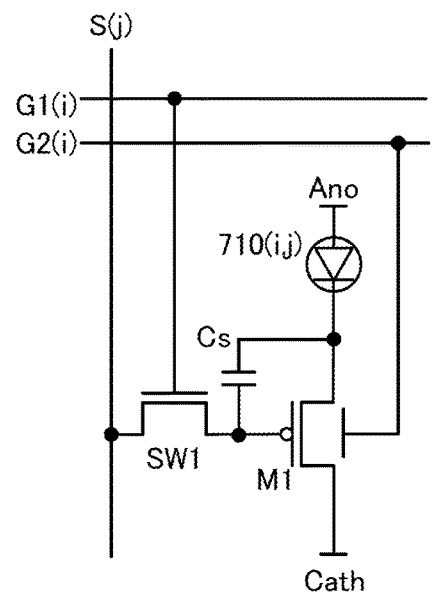

FIG. 6B is different from FIG. 1 in the following point. An active layer of a transistor M1 has p-type conductivity.

Figure 6C:
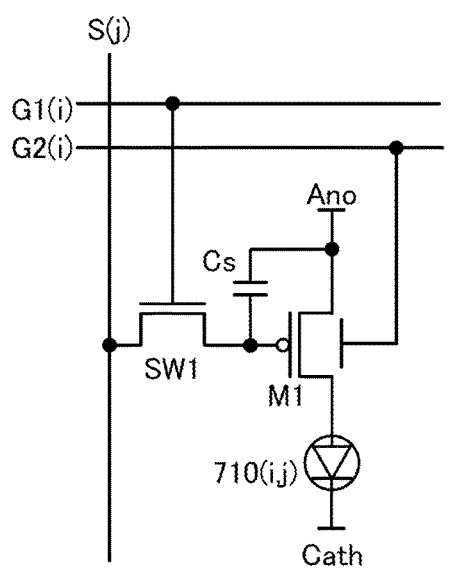

FIG. 6C is different from FIG. 6A in the following points. The active layer of the transistor M1 has p-type conductivity. The one electrode of the capacitor Cs is electrically connected to a gate of the transistor M1. Although the other electrode of the capacitor Cs is electrically connected to a source of the transistor M1, the other electrode of the capacitor Cs may be electrically connected to a drain of the transistor M1. When the other electrode of the capacitor Cs is electrically connected to the source of the transistor M1, voltage is applied from the Ano terminal to the source of the transistor M1. Therefore, it is easy to control voltage applied between the source and the gate of the transistor M.

Figure 6D:
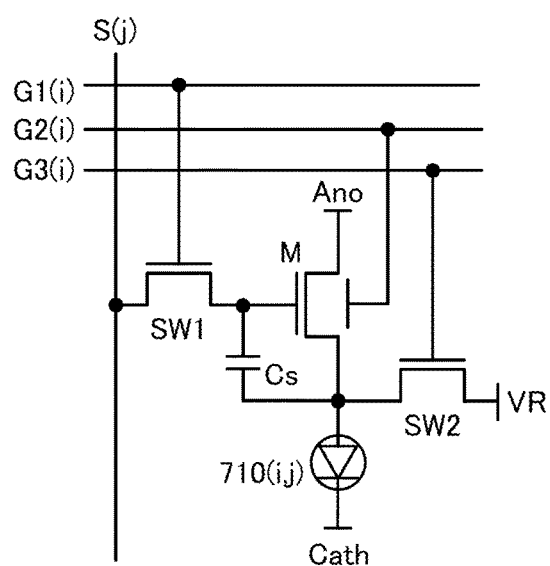

The pixel circuit 710C(i,j) in FIG. 6D further includes a scan line G3(i), a transistor SW2, and a VR terminal. A gate of the transistor SW2 is electrically connected to the scan line G3(i).

Voltage applied to the VR terminal is preferably within the range of voltage at which the light-emitting element 710(i,j) does not emit light with reference to voltage applied to the Cath terminal. Voltage is applied from the VR terminal to the source of the transistor M through the transistor SW2 before or at the same time as input of a signal to the gate of the transistor M through the transistor SW1. Since the voltage is applied from the VR terminal to the source of the transistor M, it is easy to control voltage applied between the source and the gate of the transistor M.

The structures and methods described in this embodiment can be combined as appropriate with any of the structures and methods described in the other embodiments.

(Embodiment 2)

In this embodiment, an IC chip, an electronic component, an electronic device, and the like are described as examples of a semiconductor device.

<Example of Method for Manufacturing Electronic Component>

FIG. 7A is a flow chart showing an example of a method for manufacturing an electronic component. The electronic component is also referred to as a semiconductor package or an IC package. This electronic component has a plurality of standards and names depending on a terminal extraction direction and a terminal shape. Examples of the electronic component are described in this embodiment.

A semiconductor device including a transistor is completed by integrating detachable components on a printed circuit board through an assembly process (post-process). The post-process can be finished through steps in FIG. 7A.

Specifically, after an element substrate obtained in a wafer process is completed (step ST61), a rear surface of the substrate is ground. The substrate is thinned in this step to reduce warpage or the like of the substrate in the wafer process and to reduce the size of the electronic component. Next, the substrate is divided into a plurality of chips in a dicing step (step ST62).

FIG. 7B is a top view of a semiconductor wafer 6100 before the dicing step. FIG. 7C is a partial enlarged view of FIG. 7B. A plurality of circuit regions 6102 are provided over the semiconductor wafer 6100. A semiconductor device in one embodiment of the present invention (e.g., a memory, a timer, or a CPU) is provided in the circuit region 6102.

The plurality of circuit regions 6102 are each surrounded by a separation region 6104. Separation lines (also referred to as dicing lines) 6106 are set at a position overlapping with the separation regions 6104. The semiconductor wafer 6100 is cut along the separation lines 6106 into chips 6110 including the circuit regions 6102 in the dicing step (step ST62). FIG. 7D is an enlarged view of the chip 6110.

A conductive layer or a semiconductor layer may be provided in the separation regions 6104. Providing a conductive layer or a semiconductor layer in the separation regions 6104 relieves ESD that might be caused in the dicing step, which prevents a decrease in yield caused by the dicing step. A dicing step is generally performed while supplying pure water whose specific resistance is decreased by dissolution of a carbonic acid gas or the like to a cut portion, in order to cool down a substrate, remove sward, and prevent electrification, for example. Providing a conductive layer or a semiconductor layer in the separation regions 6104 allows a reduction in the usage of pure water. Therefore, the cost of manufacturing semiconductor devices can be reduced. In addition, semiconductor devices can be manufactured with improved productivity.

After Step ST62, the divided chips are separately picked up to be mounted on and bonded to a lead frame in a die bonding step (step ST63). In the die bonding step, the chip is bonded to the lead frame by an appropriate method depending on a product, for example, bonding with a resin or a tape. In the die bonding step, the chip may be mounted on an interposer to be bonded. In a wire bonding step, lead of the lead frame is electrically connected to an electrode on the chip with a metal fine line (wire) (step ST64). A silver line or a gold line can be used as the metal fine line. Either ball bonding or wedge bonding may be used as wire bonding.

A molding step is performed to seal the wire bonded chip with an epoxy resin or the like (step ST65). With the molding step, the electronic component is filled with the resin, so that damage to a mounted circuit portion or wire due to mechanical external force can be reduced. Furthermore, degradation in characteristics due to moisture or dust can be reduced. The lead of the lead frame is plated. After that, the lead is cut and processed (step ST66). This plating step prevents rust of the lead and ensures soldering at the time of mounting the chip on a printed circuit board in a later step. Printing (marking) is performed on a surface of the package (step ST67). Through an inspection step (step ST68), the electronic component is completed (step ST69). When the electronic component includes the semiconductor device described in the above embodiment, a low-power small electronic component can be provided.

FIG. 7E is a schematic perspective view of the completed electronic component. FIG. 7E illustrates a schematic perspective view of a quad flat package (QFP) as an example of the electronic component. As illustrated in FIG. 7E, an electronic component 6000 includes a lead 6001 and a chip 6110.

The electronic component 6000 is mounted on a printed circuit board 6002, for example. When a plurality of electronic components 6000 are used in combination and electrically connected to each other over the printed circuit board 6002, the electronic components 6000 can be mounted on an electronic device. A completed circuit board 6004 is provided in the electronic device or the like. When an electronic device includes the electronic component 6000, the power consumption of the electronic device can be reduced. Alternatively, the electronic device can have smaller size.

(Embodiment 3)

In this embodiment, more specific structure examples of the display panel described in any of the above embodiments are described with reference to FIGS. 8A to 8C, FIGS. 9A to 9C, FIGS. 10A and 10B, FIGS. 11A and 11B, and FIGS. 12A and 12B. Note that in this embodiment, a display panel including a liquid crystal element and a display panel including a light-emitting element are described as examples of the display panel.

Figure 8A:
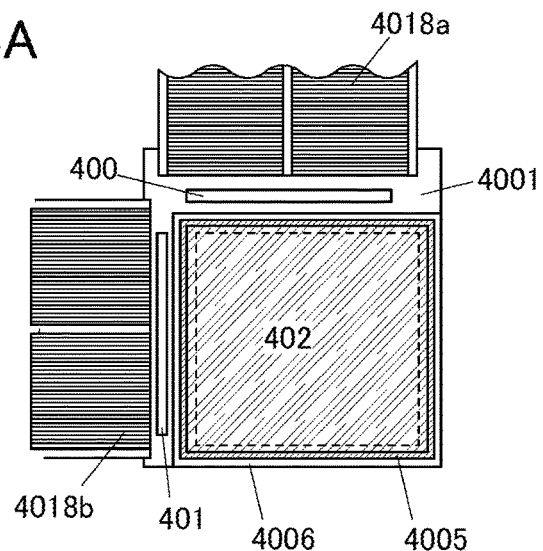
FIGS. 8A to 8C are top views each illustrating a structure example of a display panel.
Figure 8B:
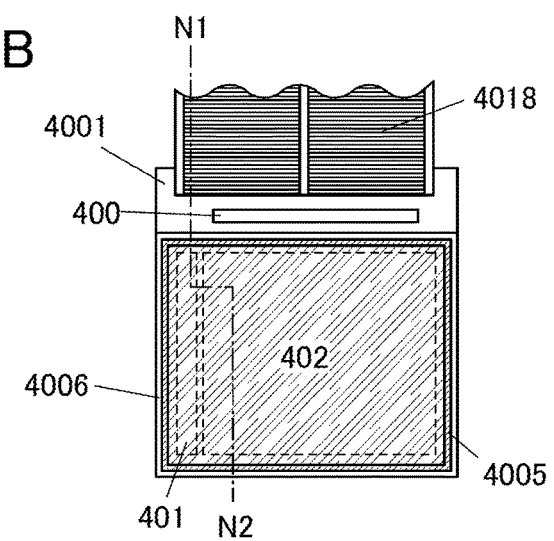
Figure 8C:
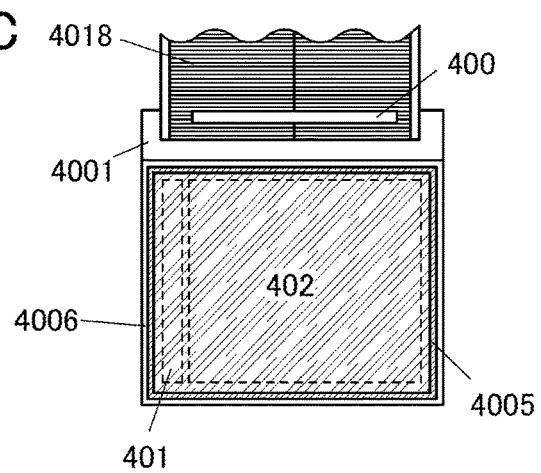

FIGS. 8A to 8C are top views each illustrating a structure example of the display panel.

In FIG. 8A, a sealant 4005 is provided to surround a pixel portion 402 provided over a first substrate 4001, and the pixel portion 402 is sealed by the sealant 4005 and a second substrate 4006. In FIG. 8A, a signal line driver circuit 400 and a scan line driver circuit 401 are each formed using a single crystal semiconductor or a polycrystalline semiconductor over another substrate in a region different from a region surrounded by the sealant 4005 over the first substrate 4001. Various signals and potentials are supplied to the signal line driver circuit 400, the scan line driver circuit 401, and the pixel portion 402 from flexible printed circuits (FPC) 4018a and 4018b.

In FIGS. 8B and 8C, the sealant 4005 is provided to surround the pixel portion 402 and the scan line driver circuit 401 that are provided over the first substrate 4001. The second substrate 4006 is provided over the pixel portion 402 and the scan line driver circuit 401. Consequently, the pixel portion 402 and the scan line driver circuit 401 are sealed together with a display element by the first substrate 4001, the sealant 4005, and the second substrate 4006. In FIGS. 8B and 8C, the signal line driver circuit 400 is formed using a single crystal semiconductor or a polycrystalline semiconductor over another substrate in a region different from the region surrounded by the sealant 4005 over the first substrate 4001. In FIGS. 8B and 8C, various signals and potentials are supplied to the signal line driver circuit 400, the scan line driver circuit 401, and the pixel portion 402 from an FPC 4018.

In FIGS. 8B and 8C, examples in which a circuit formed through a process different from that of the pixel portion 402, such as an IC, is provided as the signal line driver circuit 400 over the first substrate 4001 are illustrated; however, the structure is not limited to these examples. The scan line driver circuit 401 may be formed using an IC or the like, or only part of the signal line driver circuit 400 or only part of the scan line driver circuit 401 may be formed using an IC or the like.

The connection method of a driver circuit formed using an IC or the like is not particularly limited; wire bonding, chip on glass (COG), tape carrier package (TCP), chip on film (COF), or the like can be used. FIG. 8A illustrates an example in which the signal line driver circuit 400 and the scan line driver circuit 401 are mounted by COG. FIG. 8B illustrates an example in which the signal line driver circuit 400 is mounted by COG. FIG. 8C illustrates an example in which the signal line driver circuit 400 is mounted by TCP.

Figure 9A:
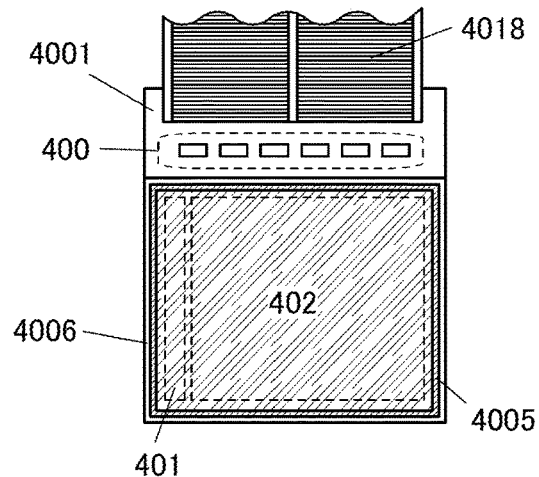
FIGS. 9A to 9C are top views each illustrating a structure example of a display panel.

In the case where the signal line driver circuit 400 is formed using an IC, the number of ICs is not limited to one and the signal line driver circuit 400 may include a plurality of ICs. Similarly, in the case where the scan line driver circuit 401 is formed using an IC, the number of ICs is not limited to one and the scan line driver circuit 401 may include a plurality of ICs. FIG. 9A illustrates an example in which six ICs are used for the signal line driver circuit 400. The signal line driver circuit including a plurality of ICs can achieve higher definition of the pixel portion 402.

Figure 9B:
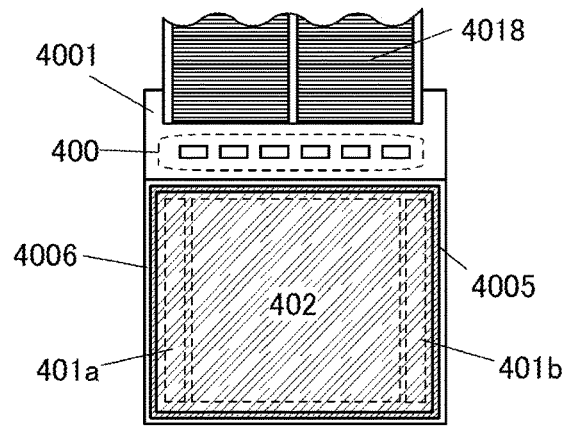

The scan line driver circuit 401 may be provided on both the left and right sides of the pixel portion 402. FIG. 9B illustrates a structure example where a scan line driver circuit 401a and a scan line driver circuit 401b are provided on the left and right sides of the pixel portion 402.

Figure 9C:
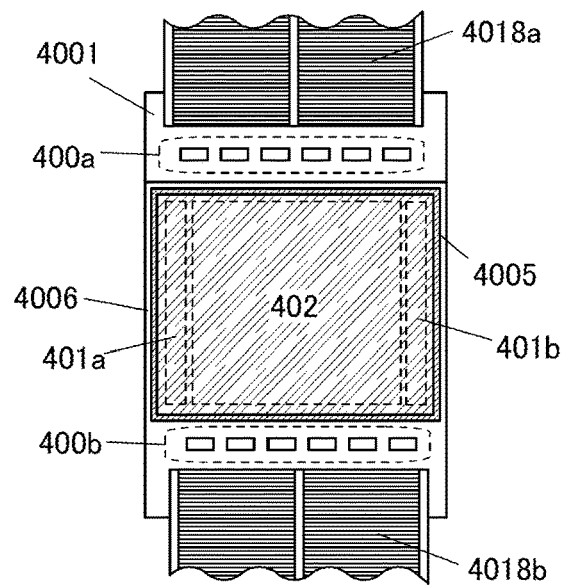

The signal line driver circuit 400 may be provided along both the top and bottom sides of the pixel portion 402. FIG. 9C illustrates a structure example where a signal line driver circuit 400a and a signal line driver circuit 400b are provided along the top and bottom sides of the pixel portion 402. Each of the signal line driver circuits includes six ICs.

FIGS. 10A and 10B are cross-sectional views each illustrating a cross-sectional structure of a portion taken along chain line N1-N2 in FIG. 8B.

The display panel in in FIGS. 10A and 10B includes an electrode 4015, and the electrode 4015 is electrically connected to a terminal included in the FPC 4018 through an anisotropic conductive layer 4019. The electrode 4015 is electrically connected to a wiring 4014 in an opening formed in insulating layers 4110, 4111, and 4112. The electrode 4015 is formed using the same conductive layer as a first electrode layer 4030.

The pixel portion 402 and the scan line driver circuit 401 provided over the first substrate 4001 include a plurality of transistors. In each of FIGS. 10A and 10B, a transistor 4010 included in the pixel portion 402 and a transistor 4011 included in the scan line driver circuit 401 are illustrated. The insulating layer 4112 is provided over the transistors 4010 and 4011 in FIG. 10A, and a partition 4510 is provided over the insulating layer 4112 in FIG. 10B.

The transistors 4010 and 4011 are provided over an insulating layer 4102. The transistors 4010 and 4011 include electrodes 517 over the insulating layer 4102. An insulating layer 4103 is formed over the electrodes 517. Semiconductor layers 512 are formed over the insulating layer 4103. Electrodes 510 and electrodes 511 are formed over the semiconductor layers 512. The insulating layer 4110 and the insulating layer 4111 are formed over the electrodes 510 and the electrodes 511. Electrodes 516 are formed over the insulating layer 4110 and the insulating layer 4111. The electrodes 510 and the electrodes 511 are formed using the same conductive layer as the wiring 4014.

In each of the transistors 4010 and 4011, the electrode 517 functions as a gate electrode; the electrode 510 functions as one of a source electrode and a drain electrode; the electrode 511 functions as the other of the source electrode and the drain electrode; and the electrode 516 functions as a back gate electrode.

Since the transistors 4010 and 4011 each include a bottom gate structure and a back gate, the on-state current of the transistors can be increased. Moreover, the threshold voltage of the transistors can be controlled.

In each of the transistors 4010 and 4011, the semiconductor layer 512 functions as a channel formation region. For the semiconductor layer 512, crystalline silicon, polycrystalline silicon, amorphous silicon, an oxide semiconductor, an organic semiconductor, or the like may be used. Impurities may be introduced to the semiconductor layer 512, as necessary, to increase the conductivity of the semiconductor layer 512 or control the threshold voltage of the transistor.

In the case where an oxide semiconductor is used for the semiconductor layer 512, the semiconductor layer 512 preferably includes indium (In). When an oxide semiconductor containing indium is used for the semiconductor layer 512, the carrier mobility (electron mobility) of the semiconductor layer 512 can be high.

The semiconductor layer 512 is not limited to the oxide semiconductor containing indium. The semiconductor layer 512 may be, for example, an oxide semiconductor that does not contain indium and contains zinc, an oxide semiconductor that does not contain indium and contains gallium, or an oxide semiconductor that does not contain indium and contains tin, e.g., a zinc tin oxide or a gallium tin oxide. Note that the details of the oxide semiconductor example will be described in Embodiment 6.

The display panel in FIGS. 10A and 10B includes a capacitor 4020. The capacitor 4020 has a region in which the electrode 511 overlaps with an electrode 4021 with the insulating layer 4103 therebetween. The electrode 4021 is formed using the same conductive layer as the electrodes 517.

FIG. 10A illustrates an example of a liquid crystal display panel in which a liquid crystal element is used as a display element. In FIG. 10A, a liquid crystal element 4013 that is the display element includes the first electrode layer 4030, a second electrode layer 4031, and a liquid crystal layer 4008. Insulating layers 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided to control the distance between the first electrode layer 4030 and the second electrode layer 4031 (cell gap). Alternatively, a spherical spacer may be used.

In the case where a liquid crystal element is used as the display element, thermotropic liquid crystal, low-molecular liquid crystal, high-molecular liquid crystal, polymer-dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like, depending on conditions.

Alternatively, a liquid crystal exhibiting a blue phase for which an alignment film is unnecessary may be used. A blue phase is one of liquid crystal phases, which is generated immediately before a cholesteric phase changes into an isotropic phase while the temperature of cholesteric liquid crystal is increased. Since the blue phase appears only in a narrow temperature range, a liquid crystal composition in which 5 wt. % or more of a chiral material is mixed is used for a liquid crystal layer in order to improve the temperature range. The liquid crystal composition that includes the liquid crystal exhibiting a blue phase and a chiral material has a short response time of 1 ms or less, and has optical isotropy, which makes alignment process unnecessary and viewing angle dependence small. An alignment film does not need to be provided and rubbing treatment is thus not necessary; accordingly, electrostatic discharge caused by the rubbing treatment can be prevented and defects and damage of the liquid crystal display panel in manufacturing process can be reduced. Thus, productivity of the liquid crystal display panel can be improved.

Furthermore, it is possible to use a method called domain multiplication or multi-domain design, in which a pixel is divided into some regions (subpixels) and molecules are aligned in different directions.

The specific resistance of the liquid crystal material is greater than or equal to $1\times10^9$ $\Omega\cdot$cm, preferably greater than or equal to $1\times10^{11}$ $\Omega\cdot$cm, more preferably greater than or equal to $1\times10^{12}$ $\Omega\cdot$cm. Note that the specific resistance in this specification is measured at 20° C.

In the case where the transistor 4010 is an oxide semiconductor transistor, the transistor 4010 can have low current in an off-state (off-state current). Accordingly, an electric signal such as an image signal can be held for a longer period, and a writing interval can be set longer in an on state. Accordingly, the frequency of refresh operation can be reduced, which leads to a reduction in power consumption.

In the display panel, a black matrix (light-blocking layer), an optical member (optical substrate) such as a polarizing member, a retardation member, or an anti-reflection member, and the like may be provided as appropriate. For example, circular polarization may be employed by using a polarizing substrate and a retardation substrate. In addition, a backlight, a side light, or the like may be used as a light source.

FIG. 10B illustrates an example of a display panel including, as a display element, a light-emitting element such as an EL element. EL elements are classified into organic EL elements and inorganic EL elements.

In the organic EL element, by supply of voltage, electrons are injected from one electrode to an EL layer and holes are injected from the other electrode to the EL layer. The carriers (electrons and holes) are recombined, and thus, a light-emitting organic compound is excited. When the light-emitting organic compound returns to a ground state from the excited state, light is emitted. Owing to such a mechanism, this light-emitting element is referred to as a current-excitation light-emitting element. In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), and the like. The EL layer can be formed by vapor deposition (including vacuum vapor deposition), a transfer method, a printing method, an inkjet method, a coating method, or the like.

The inorganic EL elements are classified into a dispersion-type inorganic EL element and a thin-film inorganic EL element depending on the element structure. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localization type light emission that utilizes inner-shell electron transition of metal ions.

FIG. 10B illustrates an example in which an organic EL element is used as a light-emitting element 4513.

In FIG. 10B, the light-emitting element 4513 is electrically connected to the transistor 4010 provided in the pixel portion 402. The structure of the light-emitting element 4513 is a layered structure including the first electrode layer 4030, a light-emitting layer 4511, and the second electrode layer 4031; however, this embodiment is not limited to this structure. The structure of the light-emitting element 4513 can be changed as appropriate depending on a direction in which light is extracted from the light-emitting element 4513, or the like.

The partition 4510 is formed using an organic insulating material or an inorganic insulating material. It is particularly preferable that the partition 4510 be formed using a photosensitive resin material to have an opening over the first electrode layer 4030 so that a side surface of the opening slopes with continuous curvature.

The light-emitting layer 4511 may be formed using a single layer or a stack of a plurality of layers.

A protective layer may be formed over the second electrode layer 4031 and the partition 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond-like carbon (DLC), or the like can be used. In addition, in a space that is enclosed by the first substrate 4001, the second substrate 4006, and the sealant 4005, a filler 4514 is provided for sealing. It is preferable that, in this manner, the light-emitting element be packaged (sealed) with a protective film (e.g., a laminate film or an ultraviolet curable resin film) or a cover member with high air-tightness and little degasification so that the light-emitting element is not exposed to the outside air.

As the filler 4514, an ultraviolet curable resin or a thermosetting resin as well as an inert gas such as nitrogen or argon can be used. For example, polyvinyl chloride (PVC), an acrylic resin, polyimide, an epoxy resin, a silicone resin, polyvinyl butyral (PVB), or ethylene vinyl acetate (EVA) can be used. A desiccant agent may be contained in the filler 4514.

A glass material such as a glass frit, or a resin material such as a two-component-mixture-type resin that is curable at room temperature, a light curable resin, or a thermosetting resin can be used for the sealant 4005. A desiccant agent may be contained in the sealant 4005.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface to reduce glare can be performed.

When the light-emitting element has a microcavity structure, light with high color purity can be extracted. Furthermore, when a microcavity structure and a color filter are used in combination, glare can be reduced and the visibility of a display image can be increased.

The first electrode layer 4030 and the second electrode layer 4031 each can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 each can be formed using one or more kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof and nitrides thereof.

Alternatively, a conductive composition containing a conductive high molecule (also called a conductive polymer) can be used for the first electrode layer 4030 and the second electrode layer 4031. As the conductive high molecule, a so-called π-electron conjugated conductive high molecule can be used. Examples include polyaniline or a derivative thereof, polypyrrole or a derivative thereof, polythiophene or a derivative thereof, and a copolymer of two or more of aniline, pyrrole, and thiophene or a derivative thereof.

In order to extract light emitted from the light-emitting element 4513 to the outside, at least one of the first electrode layer 4030 and the second electrode layer 4031 is transparent. In accordance with how to extract light, the structures of the display panels are classified into a top emission structure, a bottom emission structure, and a dual emission structure. In the top emission structure, light is extracted through a surface (top surface) opposite to a substrate where a transistor and a light-emitting element are formed. In the bottom emission structure, light is extracted through a surface (bottom surface) of a substrate where a transistor and a light-emitting element are formed. In the dual emission structure, light is extracted through a top surface and a bottom surface. For example, the second electrode layer 4031 is transparent in the case of the top emission structure. For example, the first electrode layer 4030 is transparent in the case of the bottom emission structure. For example, the first electrode layer 4030 and the second electrode layer 4031 are transparent in the case of the dual emission structure.

FIG. 11A is a cross-sectional view in which top-gate transistors are provided as the transistors 4010 and 4011 in FIG. 10A. Similarly, FIG. 11B is a cross-sectional view in which top-gate transistors are provided as the transistors 4010 and 4011 in FIG. 10B.

In each of the transistors 4010 and 4011 in FIGS. 11A and 11B, the electrode 517 functions as a gate electrode, the electrode 510 functions as one of a source electrode and a drain electrode, and the electrode 511 functions as the other of the source electrode and the drain electrode.

The description of FIGS. 10A and 10B can be referred to for the details of other components in FIGS. 11A and 11B.

Figures 12A, 12B:
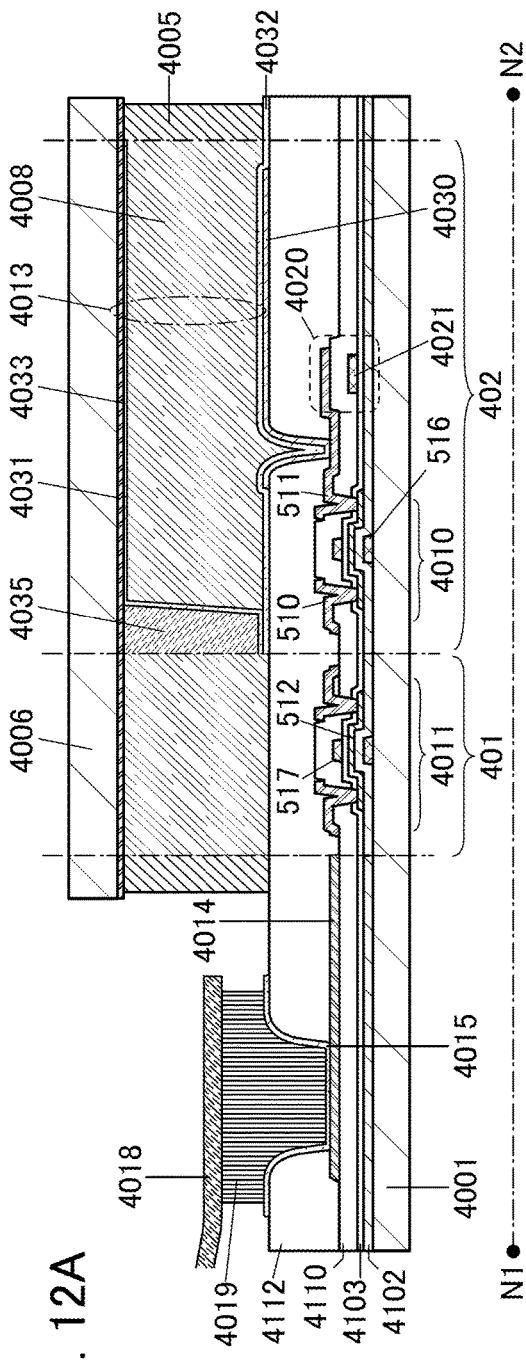
FIGS. 12A and 12B are cross-sectional views each illustrating a structure example of a display panel.

FIG. 12A is a cross-sectional view in which the transistors 4010 and 4011 in FIG. 11A each include an electrode 516 functioning as a back gate. Similarly, FIG. 12B is a cross-sectional view in which the transistors 4010 and 4011 in FIG. 11B each include the electrode 516 functioning as a back gate.

The transistors 4010 and 4011 each include a top gate and a back gate, so that the on-state current of the transistors can be increased. In addition, the threshold voltage of the transistors can be controlled.

The description of FIGS. 10A and 10B can be referred to for the details of other components in FIGS. 12A and 12B.

(Embodiment 4)

An application example of a display module including the display panel described in any of the above embodiments is described with reference to FIG. 13.

Figure 13:
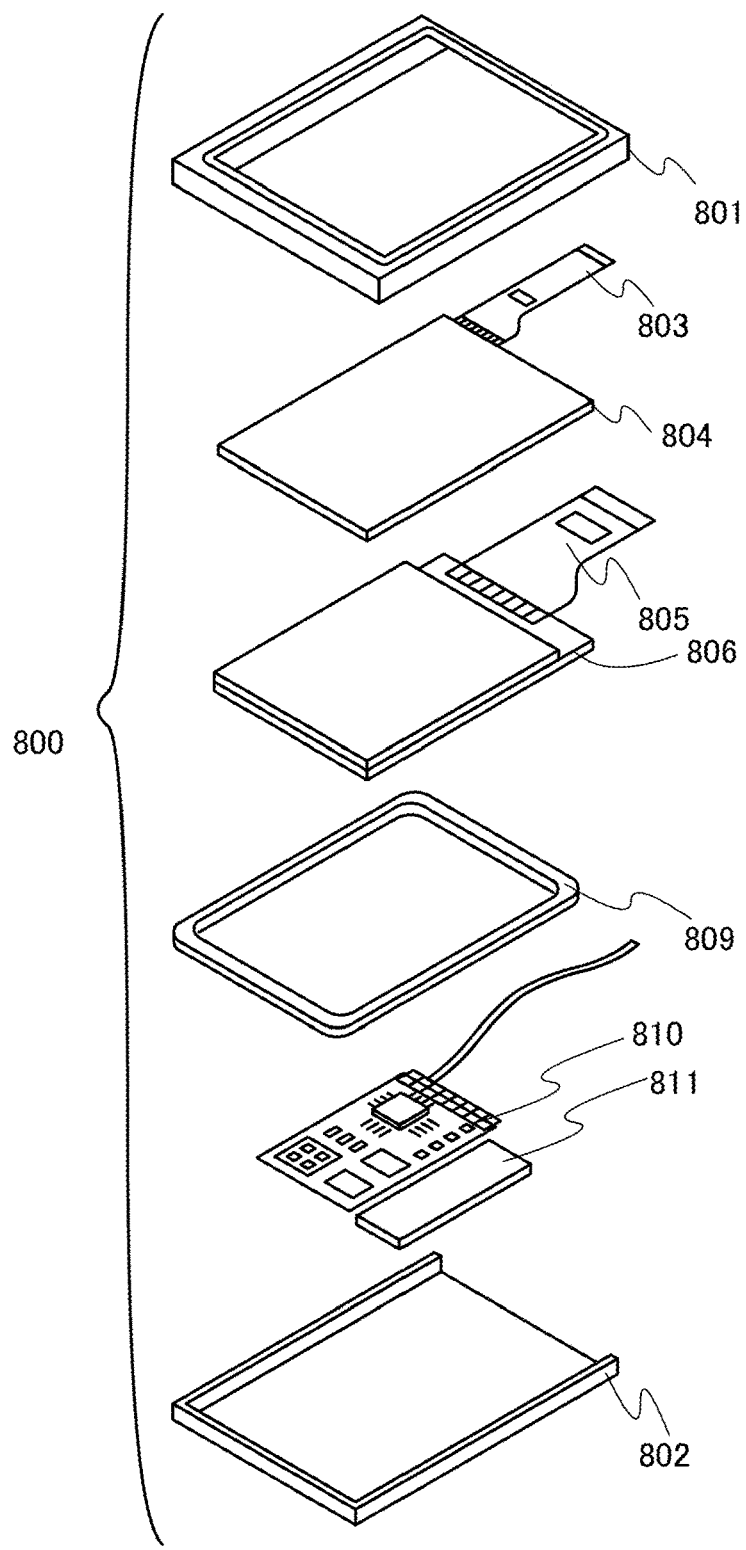
FIG. 13 illustrates an example of a display module.

In a display module 800 in FIG. 13, a touch panel 804 connected to an FPC 803, a display panel 806 connected to an FPC 805, a frame 809, a printed circuit board 810, and a battery 811 are provided between an upper cover 801 and a lower cover 802. Note that the battery 811, the touch panel 804, and the like are not provided in some cases.

The display panel described in any of the above embodiments can be used as the display panel 806 in FIG. 13.

The shapes and sizes of the upper cover 801 and the lower cover 802 can be changed as appropriate in accordance with the sizes of the touch panel 804 and the display panel 806.

The touch panel 804 can be a resistive touch panel or a capacitive touch panel and can overlap with the display panel 806. It is also possible to provide a touch panel function for a counter substrate (sealing substrate) of the display panel 806. Alternatively, an optical sensor may be provided in each pixel of the display panel 806 so that an optical touch panel can be obtained. Alternatively, an electrode for a touch sensor may be provided in each pixel of the display panel 806 so that a capacitive touch panel can be obtained. In such a case, the touch panel 804 can be omitted.

The upper cover 801 may include an optical path. Light delivered from a light source or a light source module mounted on the printed circuit board 810 passes through the optical path of the upper cover 801 and is emitted from one side of the upper cover. Then, whether there is light incident on the optical path of another side of the upper cover is determined by an optical sensor or an optical sensor module mounted on the printed circuit board 810. Thus, touch of a screen with a finger, a stylus, or the like can be sensed. In that case, the display panel 806 or the counter substrate of the display panel 806 does not have to have a touch panel function; furthermore, the touch panel 804 can be omitted.

Figure 14A:
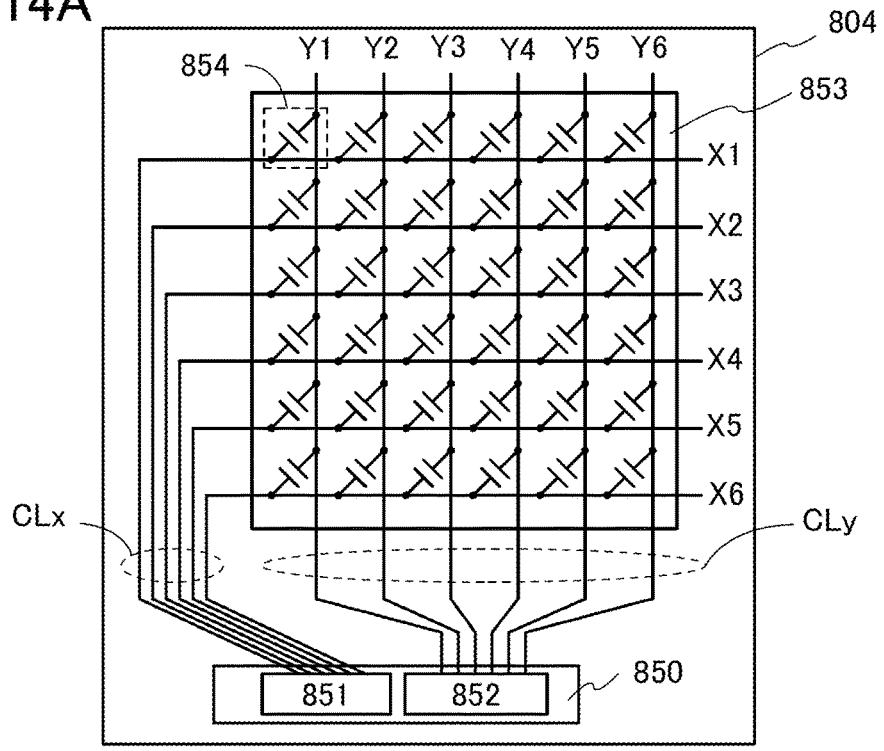
FIGS. 14A and 14B are schematic diagrams each illustrating a structure example of a touch panel.

FIG. 14A is a schematic diagram illustrating a structure example where the touch panel 804 is a mutual capacitive touch sensor. In FIG. 14A, as an example, six wirings X1 to X6 represent wirings CLx to which pulse voltage is supplied, and six wirings Y1 to Y6 represent wirings CLy that detect changes in current. The number of wirings is not limited to those illustrated in FIG. 14A. FIG. 14A also illustrates a capacitor 854 that is formed with the wiring CLx and the wiring CLy overlapping with each other or being provided close to each other.

The wirings CLx and the wirings CLy are electrically connected to an IC 850. The IC 850 includes a driver circuit 851 and a detection circuit 852.

The driver circuit 851 is, for example, a circuit for sequentially supplying pulse voltage to the wirings X1 to X6. By supplying pulse voltage to the wirings X1 to X6, an electric field is generated between the wirings CLx and CLy of the capacitors 854. With pulse voltage, current flows through the capacitor 854. An electric field generated between the wirings is changed by being blocked, for example, when a finger, a stylus, or the like touches the touch sensor. That is, for example, by touch with a finger, a stylus, or the like, the capacitance of the capacitor 854 is changed. By utilizing the change in capacitance caused by touch with a finger, a stylus, or the like as described above, the approach or contact of an object can be detected.

The detection circuit 852 is a circuit for detecting changes in current flowing through the wirings Y1 to Y6 that are caused by the changes in capacitance of the capacitors 854. No change in the current values of the wirings Y1 to Y6 is detected when there is no approach or contact of an object, whereas a decrease in the current value is detected when capacitance is decreased owing to the approach or contact of an object. In order to detect changes in current, the total amount of current may be detected. In that case, an integrator circuit or the like may be used to detect the total amount of current. Alternatively, the peak value of current may be detected. In that case, current may be converted into voltage, and the peak value of voltage may be detected.

Although the driver circuit 851 and the detection circuit 852 are formed in one IC in FIG. 14A, the driver circuit 851 and the detection circuit 852 may be formed in different ICs. The detection circuit 852 easily malfunctions due to the influence of noise, while the driver circuit 851 might be a generation source of noise. The detection circuit 852 can be prevented from malfunctioning by being formed in an IC different from an IC in which the driver circuit 851 is formed.

The driver circuit 851, the detection circuit 852, and a driver circuit of the display panel 806 may be formed in one IC, which results in a reduction in proportion of the cost of an IC in the cost of the whole display module.

Figure 14B:
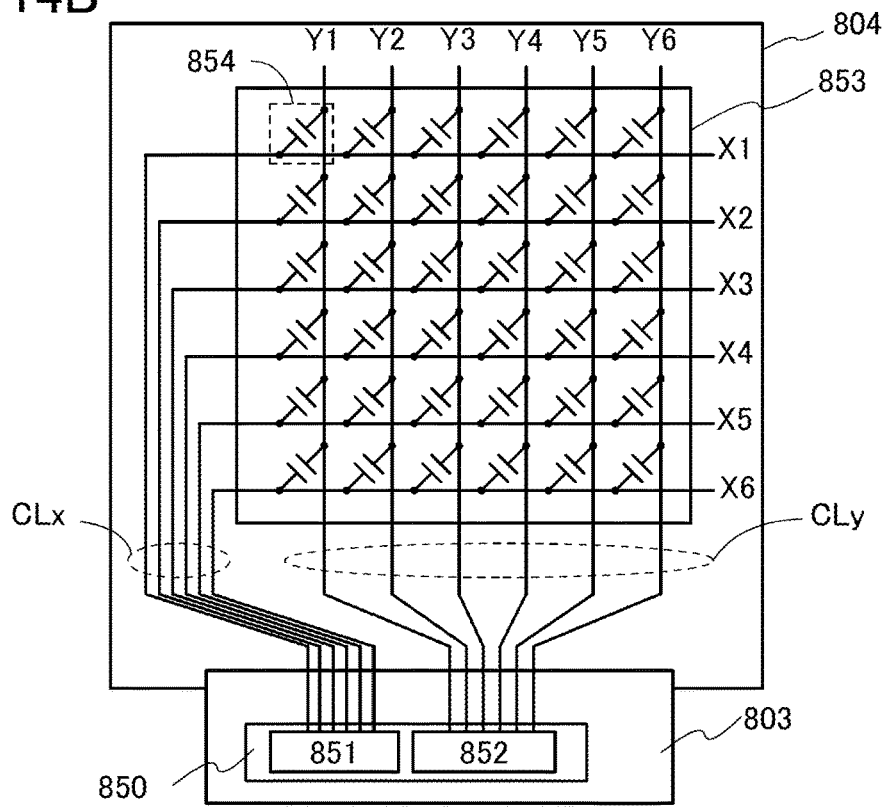

The IC 850 is provided in the touch panel 804 in FIG. 14A; however, the IC 850 may be provided in the FPC 803. FIG. 14B is a schematic view illustrating the case.

FIG. 13 is described again.

The frame 809 protects the display panel 806 and functions as an electromagnetic shield for blocking electromagnetic waves generated by the operation of the printed circuit board 810. The frame 809 may also function as a radiator plate.

The printed circuit board 810 includes a power supply circuit and a signal processing circuit for outputting a video signal and a clock signal. Furthermore, the printed circuit board 810 may include a light source and an optical sensor for touch sensing. The wavelength of light from the light source is preferably longer than 780 nm, more preferably longer than 1.6 μm. The optical sensor has a function of sensing light within the wavelength range of the light source. As a power source for supplying power to the power supply circuit, an external commercial power source or a separate power source using the battery 811 may be used. The battery 811 can be omitted in the case of using a commercial power source.

The display module 800 may be additionally provided with a member such as a polarizing plate, a retardation plate, or a prism sheet.

(Embodiment 5)

In this embodiment, electronic devices and lighting devices in one embodiment of the present invention are described with reference to drawings.

Structure examples of electronic devices are described below with reference to FIGS. 15A to 15C and FIGS. 16A to 16E. Note that a touch panel including a touch sensor may be used for a display portion of each of the electronic devices in FIGS. 15A to 15C and FIGS. 16A to 16C. With the touch panel, the display portion can also function as an input portion of the electronic device.

Figure 15A:
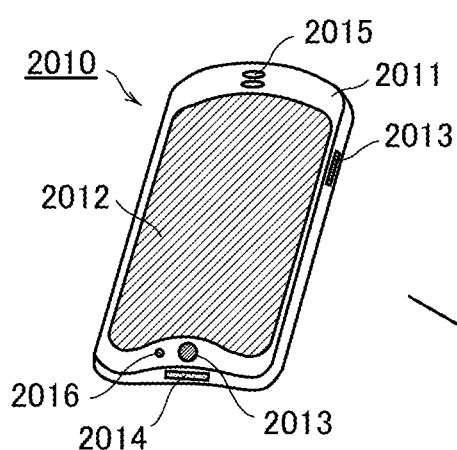
FIGS. 15A to 15C each illustrate a structure example of an electronic device.

An information terminal 2010 in FIG. 15A includes a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Various operations such as making a phone call, inputting characters, and screen switching of the display portion 2012 can be performed by touching the display portion 2012 with a finger or the like. The information terminal 2010 can be operated by inputting sound from the microphone 2016. Various operations such as power on/off operation and screen switching of the display portion 2012 can be performed by pressing the operation button 2013.

Figure 15B:
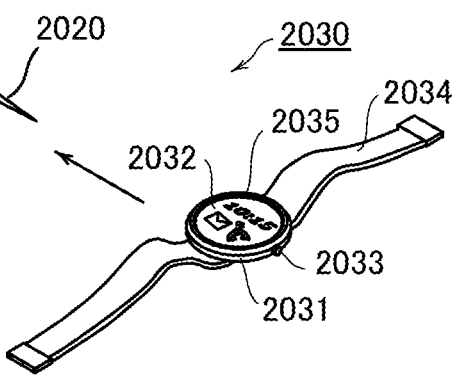

FIG. 15B illustrates an example of a watch-type information terminal. An information terminal 2030 includes a housing 2031, a display portion 2032, a winding crown 2033, a belt 2034, and a sensing unit 2035. The information terminal 2030 can be operated by rotating the winding crown 2033. The information terminal 2030 can be operated by touching the display portion 2032 with a finger.

The sensing unit 2035 has a function of obtaining information on usage environment and biological information. The sensing unit 2035 may be provided with a microphone, an imaging element, an acceleration sensor, a direction sensor, a pressure sensor, a temperature sensor, a humidity sensor, an illumination sensor, a positioning sensor (e.g., a global positioning system (GPS)), or the like.

Wireless communication devices with the same standard may be incorporated into the information terminal 2010 and the information terminal 2030 so that interactive communication is possible through a wireless signal 2020. When the information terminal 2010 receives an incoming e-mail or call, for example, information notifying the incoming e-mail or call can be displayed on the display portion 2032 of the information terminal 2030.

Figure 15C:
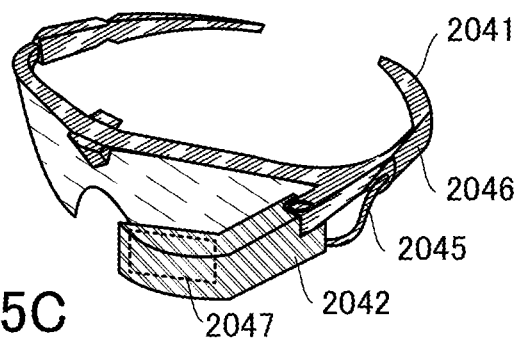

FIG. 15C illustrates an example of a glasses-type information terminal. An information terminal 2040 includes a mounting portion 2041, a housing 2042, a cable 2045, a battery 2046, and a display portion 2047. The battery 2046 is stored in the mounting portion 2041. The display portion 2047 is provided in the housing 2042. The housing 2042 includes a processor, a wireless communication device, a storage device, and a variety of electronic components. Power is supplied from the battery 2046 to the display portion 2047 and the electronic components in the housing 2042 through the cable 2045. A variety of information such as an image or the like transmitted wirelessly is displayed on the display portion 2047. The use of line-sequential impulsive driving described in Embodiment 1 can improve the resolution of a moving image and can reduce power consumption while suppressing a flicker.

An information terminal or the like that performs communication with a wireless signal can have a function of generating energy by any one of an electromagnetic coupling method, an electromagnetic induction method, and a radio wave method with an antenna used for the communication.

The housing 2042 may be provided with a camera. The information terminal 2040 can be operated by sensing movement of a user's eyeball or eyelid with the camera.

The mounting portion 2041 may be provided with a variety of sensors such as a temperature sensor, a pressure sensor, an acceleration sensor, and a biological sensor. For example, the biological sensor obtains biological information about the user and then stores the biological information in the storage device of the housing 2042. Interactive communication between the information terminal 2010 and the information terminal 2040 is possible through a wireless signal 2021, for example. The information terminal 2040 transmits the stored biological information to the information terminal 2010. The information terminal 2010 calculates the degree of fatigue, the amount of activity, and the like of the user from the received biological information.

Figure 16A:
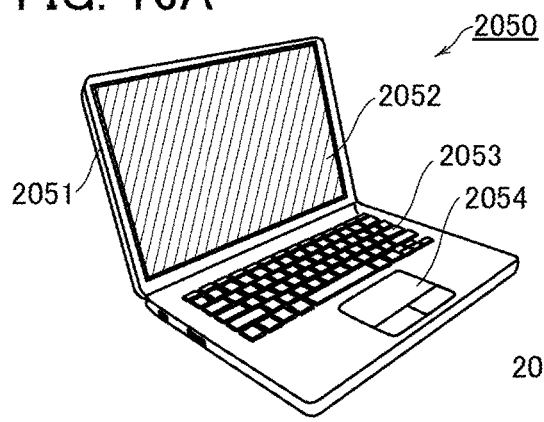
FIGS. 16A to 16E each illustrate a structure example of an electronic device.

A laptop 2050 in FIG. 16A includes a housing 2051, a display portion 2052, a keyboard 2053, and a pointing device 2054. The laptop 2050 can be operated by touch operation of the display portion 2052.

Figure 16B:
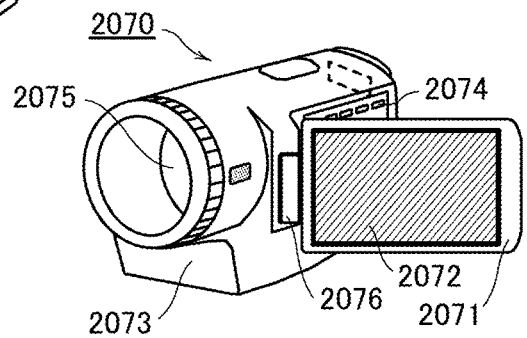

A video camera 2070 in FIG. 16B includes a housing 2071, a display portion 2072, a housing 2073, an operation key 2074, a lens 2075, and a joint 2076. The display portion 2072 is provided in the housing 2071. The operation key 2074 and the lens 2075 are provided in the housing 2073. The housing 2071 and the housing 2073 are connected to each other with the joint 2076, and the angle between the housing 2071 and the housing 2073 can be changed with the joint 2076. Images on the display portion 2072 may be switched in accordance with the angle between the housing 2071 and the housing 2073 at the joint 2076. Various operations such as starting or stopping video recording, magnification and zoom adjustment, and changing a shooting range can be performed by touch operation of the display portion 2072.

Figure 16C:
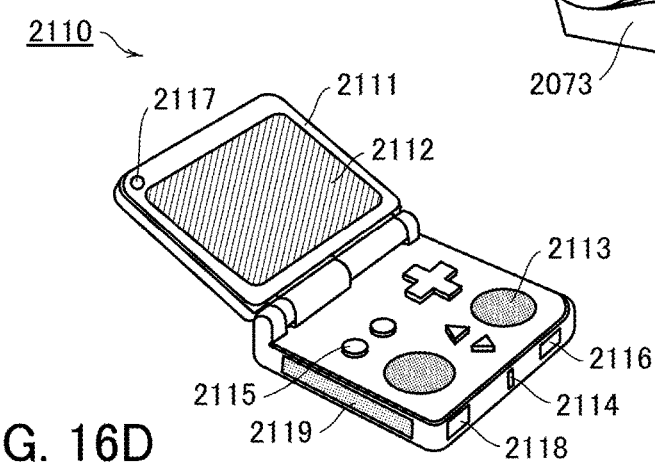

A portable game machine 2110 in FIG. 16C includes a housing 2111, a display portion 2112, speakers 2113, an LED lamp 2114, operation key buttons 2115, a connection terminal 2116, a camera 2117, a microphone 2118, and a recording medium read portion 2119.

Figure 16D:
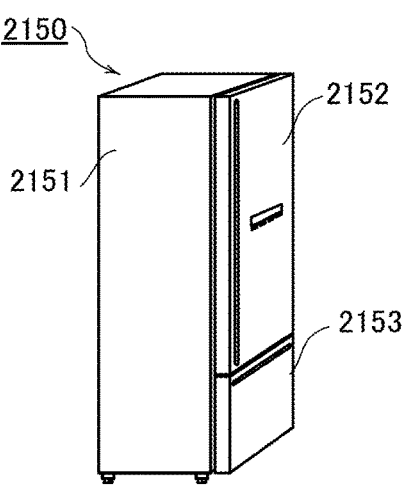

An electric refrigerator-freezer 2150 in FIG. 16D includes a housing 2151, a refrigerator door 2152, a freezer door 2153, and the like.

Figure 16E:
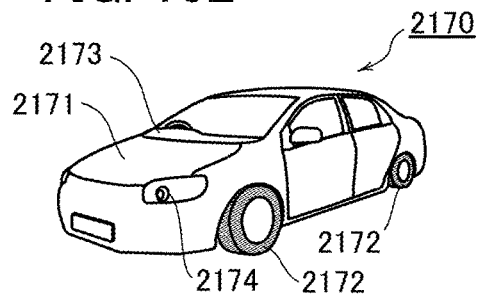

A motor vehicle 2170 in FIG. 16E includes a car body 2171, wheels 2172, a dashboard 2173, lights 2174, and the like. The processor in Embodiment 2 is used as each of processors in the motor vehicle 2170.

(Embodiment 6)
<Composition of CAC-OS>

The composition of a cloud aligned composite OS (CAC-OS) that can be used for a transistor disclosed in one embodiment of the present invention is described below.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed in regions each having a size of greater than or equal to 0.5 nm and less than or equal to 10 nm, preferably greater than or equal to 1 nm and less than or equal to 2 nm, or a similar size and the regions including the one or more metal elements are mixed is referred to as a mosaic pattern or a patch-like pattern.

Note that the oxide semiconductor preferably contains at least indium. In particular, indium and zinc are preferably contained. In addition, one or more elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, or the like may be contained.

As an example of the CAC-OS, an In—Ga—Zn oxide with the CAC composition (such an In—Ga—Zn oxide may be particularly referred to as CAC-IGZO) is described. The CAC-IGZO has a composition with a mosaic pattern in which materials are separated into indium oxide ($InO_{X1}$, where X1 is a real number greater than 0) or indium zinc oxide ($In_{X2}Zn_{Y2}O_{Z2}$, where X2, Y2, and Z2 are each a real number greater than 0) and gallium oxide ($GaO_{X3}$, where X3 is a real number greater than 0) or gallium zinc oxide ($Ga_{X4}Zn_{Y4}O_{Z4}$, where X4, Y4, and Z4 are each a real number greater than 0), for example. Furthermore, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is higher than the atomic ratio of In to the element M in a second region, the first region has higher In concentration than the second region.

Note that a compound containing In, Ga, Zn, and O is also commonly known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ (−1≤x0≤1; m0 is a given number).

The crystalline compound has a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In part of the material composition of a CAC-OS containing In, Ga, Zn, and O, nanoparticle regions including Ga as a main component and nanoparticle regions including In as a main component are observed. These nanoparticle regions are randomly dispersed in a mosaic pattern. Therefore, the crystal structure is a secondary element for the CAC-OS.

Note that the CAC-OS does not include a layered structure of two or more films with different compositions. For example, a two-layer structure of a film including In as a main component and a film including Ga as a main component is not included.

It is difficult to observe a clear boundary between the region including $GaO_{X3}$ as a main component and the region including $In_{X2}Zn_{Y2}O_{Z2}$ or $InO_{X1}$ as a main component in some cases.

In part of the composition of a CAC-OS that contains, instead of gallium, one or more metal elements selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, or the like, nanoparticle regions including the one or more metal elements as a main component and nanoparticle regions including In as a main component are observed. These nanoparticle regions are randomly dispersed in a mosaic pattern.

The CAC-OS can be formed by sputtering under conditions where a substrate is not heated intentionally, for example. In the case where the CAC-OS is formed by sputtering, one or more gases selected from an inert gas (typically, argon), an oxygen gas, and a nitrogen gas may be used as a deposition gas. The percentage of the oxygen gas flow rate in the total flow rate of the deposition gas at the time of deposition is preferably as low as possible; for example, the percentage of the oxygen gas flow rate is preferably higher than or equal to 0% and lower than 30%, more preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS that is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in the plan-view direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the region including $GaO_{X3}$ as a main component and the region including $In_{X2}Zn_{Y2}O_{Z2}$ or $InO_{X1}$ as a main component are unevenly distributed and mixed.

The CAC-OS has a structure and characteristics different from those of an IGZO compound in which metal elements are evenly distributed. That is, in the CAC-OS, regions including $GaO_{X3}$ or the like as a main component and regions including $In_{X2}Zn_{Y2}O_{Z2}$ or $InO_{X1}$ as a main component are phase-separated from each other in a mosaic pattern.

The conductivity of the region including $In_{X2}Zn_{Y2}O_{Z2}$ or $InO_{X1}$ as a main component is higher than that of the region including $GaO_{X3}$ or the like as a main component. In other words, when carriers flow through the region including $In_{X2}Zn_{Y2}O_{Z2}$ or $InO_{X1}$ as a main component, the oxide semiconductor exhibits conductivity. Accordingly, when the regions including $In_{X2}Zn_{Y2}O_{Z2}$ or $InO_{X1}$ as a main component are distributed in the oxide semiconductor like a cloud, high field-effect mobility (μ) can be achieved.

In contrast, the insulating property of the region including $GaO_{X3}$ or the like as a main component is higher than that of the region including $In_{X2}Zn_{Y2}O_{Z2}$ or $InO_{X1}$ as a main component. In other words, when the regions including $GaO_{X3}$ or the like as a main component are distributed in the oxide semiconductor, leakage current can be reduced and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, so that high on-state current (Ion) and high field-effect mobility (μ) can be achieved.

A semiconductor element including a CAC-OS has high reliability. Thus, the CAC-OS is suited for a variety of semiconductor devices typified by a display.

At least part of this embodiment can be implemented in combination with any of the other embodiments described in this specification as appropriate.

This application is based on Japanese Patent Application Serial No. 2016-111536 filed with Japan Patent Office on Jun. 3, 2016, the entire contents of which are hereby incorporated by reference.

What is claimed is:

1. A method for driving a display device, the display device comprising:
   a pixel circuit comprising a light-emitting element, a first transistor, and a second transistor,
   wherein a gate of the first transistor is electrically connected to a first scan line, a first terminal of the first transistor is electrically connected to a signal line, a second terminal of the first transistor is electrically connected to a gate of the second transistor, a first terminal of the second transistor is electrically connected to one electrode of the light-emitting element, and a back gate of the second transistor is electrically connected to a second scan line, and
   wherein the light-emitting element is not directly connected to any transistor other than the second transistor, the method comprising the steps of:
   applying a first voltage to the gate of the second transistor so that the light-emitting element emits light in a first period of one frame period; and applying a second voltage to the back gate of the second transistor so that the light-emitting element does not emit light in a second period of the one frame period.

2. The method according to claim 1, wherein at least one of the first transistor and the second transistor comprises an oxide semiconductor in a channel formation region.

3. The method according to claim 1, wherein the light-emitting element comprises an organic compound layer.

4. The method according to claim 1, wherein gradation of the light-emitting element is controlled in the first period.

5. The method according to claim 1, wherein a cathode voltage is applied to a second terminal of the second transistor.

6. A method for driving a display device,
the display device comprising:
   a pixel circuit comprising a light-emitting element, a first transistor, and a second transistor,
   wherein a gate of the first transistor is electrically connected to a first scan line, a first terminal of the first transistor is electrically connected to a signal line, a second terminal of the first transistor is electrically connected to a gate of the second transistor, a first terminal of the second transistor is electrically connected to one electrode of the light-emitting element, and a back gate of the second transistor is electrically connected to a second scan line, and
   wherein the light-emitting element is not directly connected to any transistor other than the second transistor,
the method comprising the steps of:
   applying a first voltage to the gate of the second transistor so that the light-emitting element emits light in a first period of one frame period;
   applying a second voltage to the back gate of the second transistor in the first period; and
   applying a third voltage to the back gate of the second transistor so that the light-emitting element does not emit light in a second period of the one frame period,
   wherein the second voltage is higher than or equal to a voltage of the first terminal of the second transistor, and
   wherein the third voltage is lower than the voltage of the first terminal of the second transistor.

7. The method according to claim 6, wherein at least one of the first transistor and the second transistor comprises an oxide semiconductor in a channel formation region.

8. The method according to claim 6, wherein the light-emitting element comprises an organic compound layer.

9. The method according to claim 6,
   wherein the first voltage is applied from the signal line to the gate of the second transistor through the first terminal and the second terminal of the first transistor, and
   wherein the second voltage and the third voltage are applied from the second scan line to the back gate of the second transistor.

10. The method according to claim 6, wherein gradation of the light-emitting element is controlled in the first period.

11. The method according to claim 6, wherein a cathode voltage is applied to a second terminal of the second transistor.

12. A method for driving a display device,
the display device comprising:
   a gate driver; and
   a pixel circuit comprising a light-emitting element, a first transistor, and a second transistor,
   wherein a gate of the first transistor is electrically connected to a first scan line, a first terminal of the first transistor is electrically connected to a signal line, a second terminal of the first transistor is electrically connected to a gate of the second transistor, a first terminal of the second transistor is electrically connected to one electrode of the light-emitting element, and a back gate of the second transistor is electrically connected to a second scan line, and
   wherein the light-emitting element is not directly connected to any transistor other than the second transistor,
the method comprising the steps of:
   outputting a first signal from the gate driver to the first scan line;
   outputting a second signal from the gate driver to the second scan line;
      applying a first voltage to the gate of the second transistor so that the light-emitting element emits light in a first period of one frame period;
   applying a second voltage to the back gate of the second transistor in the first period; and
   applying a third voltage to the back gate of the second transistor so that the light-emitting element does not emit light in a second period of the one frame period,
   wherein the second voltage is higher than or equal to a voltage of the first terminal of the second transistor, and
   wherein the third voltage is lower than the voltage of the first terminal of the second transistor.

13. The method according to claim 12, wherein at least one of the first transistor and the second transistor comprises an oxide semiconductor in a channel formation region.

14. The method according to claim 12, wherein the light-emitting element comprises an organic compound layer.

15. The method according to claim 12,
   wherein the first voltage is applied from the signal line to the gate of the second transistor through the first terminal and the second terminal of the first transistor, and
   wherein the second voltage and the third voltage are applied from the second scan line to the back gate of the second transistor.

16. The method according to claim 12, wherein gradation of the light-emitting element is controlled in the first period.

17. The method according to claim 12, wherein a cathode voltage is applied to a second terminal of the second transistor.

* * * * *